(12) United States Patent
Lu et al.

(10) Patent No.: US 10,009,127 B1
(45) Date of Patent: Jun. 26, 2018

(54) PARTITIONING OF SURFACES OF STRUCTURES IN PROPAGATION MODELING

(71) Applicants: Polaris Wireless, Inc., Mountain View, CA (US); Alma Mater Studiorum—Università di Bologna, Bologna (IT)

(72) Inventors: Jonathan Shiao-en Lu, San Jose, CA (US); Vittorio Degli-Esposti, Sasso Marconi (IT); Enrico Maria Vitucci, Rimini (IT)

(73) Assignees: Polaris Wireless, Inc., Mountain View, CA (US); Alma Mater Studiorum—Università di Bologna, Bologna (IT)

( * ) Notice: Subject to any disclaimer, the term of this patent is extended or adjusted under 35 U.S.C. 154(b) by 0 days. days.

(21) Appl. No.: 15/633,828

(22) Filed: Jun. 27, 2017

(51) Int. Cl.
| | |
|---|---|
| *H04B 17/00* | (2015.01) |
| *H04B 17/30* | (2015.01) |
| *G01R 29/08* | (2006.01) |
| *H04B 17/318* | (2015.01) |
| *H04B 17/364* | (2015.01) |
| *H04B 17/373* | (2015.01) |

(52) U.S. Cl.
CPC ............ *H04B 17/30* (2015.01); *G01R 29/08* (2013.01); *H04B 17/318* (2015.01); *H04B 17/364* (2015.01); *H04B 17/373* (2015.01)

(58) Field of Classification Search
CPC .... H04B 17/30; H04B 17/373; H04B 17/364; H04B 17/318; G01R 29/08
USPC .................................................... 455/67.16
See application file for complete search history.

(56) References Cited

U.S. PATENT DOCUMENTS

| | | |
|---|---|---|
| 5,450,615 A | 9/1995 | Fortune et al. |
| 6,525,726 B1 * | 2/2003 | Xie .................. G06T 15/40 345/421 |
| 7,962,102 B2 | 6/2011 | Corral et al. |
| | (Continued) | |

OTHER PUBLICATIONS

V. Degli-Esposti, J. S. Lu, E. M. Vitucci, F. Fuschini, M. Barbiroli, J. Blaha, H. L. Bertoni, An Environment—Driven, Fully Dscrete, Parallelized Ray-Launching Field Prediction Algorithm, European Cooperation in Science and Technology (Euro-COST), Graz, Austria, Sep. 13-14, 2017.

*Primary Examiner* — Eugene Yun
(74) *Attorney, Agent, or Firm* — McGeary Cukor LLC; Kenneth Ottesen; Jason Paul DeMont

(57) ABSTRACT

A system and method for ray launching in electromagnetic wave propagation modeling. A data-processing system receives a dataset that is representative of one or more structures within an environment, including a structure that is defined in the dataset as having at least a first surface. The data-processing system establishes a bounding box that is representative of the first surface and partitions at least a portion of the bounding box into a first set of tiles. The data-processing system then projects a first set of ray tubes from a predetermined point within the environment, to the tiles in the first set of tiles. Each ray tube in the first set of ray tubes is defined by a corresponding tile in the first set of tiles. The data-processing system evaluates the incidence of bounced ray tubes at a predetermined receive point within the environment and presents a propagation result that is based on the evaluated incidence.

23 Claims, 15 Drawing Sheets

(56) References Cited

U.S. PATENT DOCUMENTS

| | | | |
|---|---|---|---|
| 8,704,826 B1 * | 4/2014 | Hakura | G06F 9/44 345/419 |
| 8,970,584 B1 * | 3/2015 | Aila | G06T 11/40 345/420 |
| 2009/0144037 A1 | 6/2009 | Sibecas et al. | |
| 2011/0102420 A1 | 5/2011 | Yoon et al. | |

* cited by examiner

PARTITIONING OF SURFACES OF STRUCTURES IN PROPAGATION MODELING

FIELD OF THE INVENTION

The present invention relates to electromagnetic wave propagation modeling in general, and, more particularly, to the partitioning of one or more surfaces of structures into tiles that are used in the modeling.

BACKGROUND OF THE INVENTION

The modeling of electromagnetic wave propagation throughout an environment can be performed in order to characterize the effect of buildings, as well as that of other types of structures and objects in general, on signal propagation through the modeled environment. Wave propagation modeling can be performed for various reasons, including a need to understand existing telecommunications system coverage and a need to predict potential coverage configurations.

In a modeling of wave propagation, ray propagation methods are often used for analyzing signal propagation. Ray propagation methods include ray tracing and ray launching. Ray tracing is based on tracing signal paths from a first point to a second point. The rays are traced from the first point to the second point for determining which rays have impinged on the second point.

FIGS. 1A and 1B depict diagrams of the salient components of telecommunications system 100 in the prior art comprising cellular base station 101 and wireless terminal 102. Base station 101 and terminal 102 are in communication with each other via a transmission path or paths comprising one or more propagation components. A modeling of wave propagation in the downlink direction (i.e., from base station to terminal) involves considering base station 101 as a signal source, which is sometimes referred to as a "transmit point," and terminal 102 as the target, which is sometimes referred to as a "receive point." Within a ray-tracing context, as shown in FIG. 1A, one or more objects 103-1 through 103-4 are accounted for as to how rays 104-1 through 104-5 are received at the target from the signal source, by tracing each ray and starting from the target. Alternatively, one or more objects 103-1 through 103-4 can be accounted for by tracing each ray in the other direction (i.e., starting at base station 101 and tracing to terminal 102).

In contrast to ray tracing, ray launching in the prior art is a method in which multiple rays are launched in predetermined directions from the signal source such as base station 101. Because the base station location is in a fixed position, the rays are always launched from it. As shown in FIG. 1B, the paths of many rays are considered in a forward direction (i.e., from the signal source), and not merely those rays that impinge on the target as in FIG. 1A. In ray launching, the simulation continues until a predetermined termination condition is met.

Ray tracing and ray launching techniques in the prior art have their relative advantages and disadvantages. For example, ray tracing is suitable for determining the receipt of signals at a particular target, such as wireless terminal 102, while ray launching is better suited for wide-area simulations—that is, simulations of radio signal coverage through a defined area, rather than at a particular point. Both classes of methods, however, are computationally intensive in that they require significant amounts of processing cycles, computer memory, and/or other resources, depending on the parameters of the simulation.

SUMMARY OF THE INVENTION

The present invention enables discrete ray launching of ray tubes, by first partitioning one or more surfaces of structures and other objects in a dataset that is to be used in electromagnetic wave propagation modeling. Each surface is represented by a bounding box, which is then partitioned mathematically into one or more tiles. The tiles can be used to define one or more ray tubes that are projected.

In accordance with the illustrative embodiment of the present invention, a disclosed data-processing system receives a dataset that is representative of one or more structures within an environment, including a first structure that is defined in the dataset as having at least a first surface. The first structure can be a building, or it can be some other type of object within the environment to be modeled.

The data-processing system establishes a bounding box for the first surface and partitions at least a portion of the bounding box into a first set of tiles. The data-processing system can similarly partition bounding boxes for other objects that are represented in the dataset, such as the ground near one or more of the structures. In partitioning the bounding boxes into tiles, it can be said that the data-processing system "discretizes" the surfaces that are represented by the bounding boxes.

The data-processing system then launches, or, more specifically, "projects," a first set of ray tubes from a predetermined point within the environment, to the tiles in the first set. The point can be from which a signal is transmitted or it can be a reference point on a tile from which a ray tube is being bounced. In some embodiments of the present invention, each ray tube in the first set can be defined by a corresponding tile in the first set toward which the ray tube in the first set is projected.

At some point in the processing, the data-processing system evaluates the incidence of bounced ray tubes at a predetermined receive point within the environment. At least one of the bounced ray tubes in the evaluation can be based on at least one of the ray tubes projected in the first set. The data-processing system then presents a propagation result that is based on the evaluated incidence of the bounced ray tubes at the receive point.

Often, a surface that is being partitioned is complex in shape. Such is the case of an exterior side of an architecturally complex building, whose outline can resemble something other than a simple rectangle. The use of a bounding box in partitioning a surface into tiles is advantageous, in that it provides a computationally straightforward way of both representing the surface and providing an area or space that is often more easily subdivided into tiles than the surface of the building or structure itself.

An illustrative method for ray launching comprises: receiving, by a data-processing system, a dataset that is representative of a first structure within an environment, wherein the first structure is defined in the dataset as having a first surface; establishing, by the data-processing system, a first bounding box for the first surface; partitioning, by the data-processing system, at least a portion of the first bounding box into a first nonempty set of tiles, wherein the tiles in the first set of tiles have a first shape; projecting, by the data-processing system, a first nonempty set of ray tubes from a predetermined point toward the tiles in the first set of tiles, wherein each ray tube in the first set of ray tubes is defined by a corresponding tile in the first set of tiles toward which the ray tube in the first set of ray tubes is projected; evaluating, by the data-processing system, an incidence of bounced ray tubes at a predetermined receive point within the environment, wherein at least one of the bounced ray tubes is traceable to a ray tube projected in the first set of ray tubes; and presenting, by the data-processing system, a propagation result that is based on the evaluating of the incidence of bounced ray tubes.

Another illustrative method for ray launching comprises: receiving, by a data-processing system, a dataset that is representative of a first structure within an environment, wherein the first structure is defined in the dataset as having a first surface; establishing, by the data-processing system, i) a first bounding box for the first surface and ii) a second bounding box for a second surface represented in the dataset; partitioning, by the data-processing system, i) at least a portion of the first bounding box into a first nonempty set of tiles and ii) the second bounding box into a second nonempty set of tiles; projecting, by the data-processing system, i) a first nonempty set of ray tubes from a predetermined point toward the tiles in the first set of tiles, wherein each ray tube in the first set of ray tubes is defined by a corresponding tile in the first set of tiles toward which the ray tube in the first set of ray tubes is projected, and ii) a second nonempty set of ray tubes from the point toward the tiles in the second set of tiles, wherein each ray tube in the second set of ray tubes is defined by a corresponding tile in the second set of tiles toward which the ray tube in the second set of ray tubes is projected; evaluating, by the data-processing system, an incidence of bounced ray tubes at a predetermined receive point within the environment, wherein at least one of the bounced ray tubes is traceable to a ray tube projected in the first set of ray tubes or the second set of ray tubes; and presenting, by the data-processing system, a propagation result that is based on the evaluating of the incidence of bounced ray tubes.

Yet another illustrative method for ray launching comprises: receiving, by a data-processing system, a dataset that is representative of a first structure within an environment, wherein the first structure is defined in the dataset as having a first surface; establishing, by the data-processing system, i) a first bounding box for the first surface, wherein the first bounding box is oriented based on the outline of the first surface, and ii) a second bounding box for a second surface represented in the dataset, wherein the second bounding box is oriented based on the outline of the second surface; partitioning, by the data-processing system, i) at least a portion of the first bounding box into a first nonempty set of tiles and ii) the second bounding box into a second nonempty set of tiles; projecting, by the data-processing system, i) a first nonempty set of ray tubes from a predetermined point toward the tiles in the first set of tiles, wherein each ray tube in the first set of ray tubes is defined by a corresponding tile in the first set of tiles toward which the ray tube in the first set of ray tubes is projected, and ii) a second nonempty set of ray tubes from the point toward the tiles in the second set of tiles, wherein each ray tube in the second set of ray tubes is defined by a corresponding tile in the second set of tiles toward which the ray tube in the second set of ray tubes is projected; evaluating, by the data-processing system, an incidence of bounced ray tubes at a predetermined receive point within the environment, wherein at least one of the bounced ray tubes is traceable to a ray tube projected in the first set of ray tubes or the second set of ray tubes; and presenting, by the data-processing system, a propagation result that is based on the evaluating of the incidence of bounced ray tubes.

DETAILED DESCRIPTION

Figure 1A:
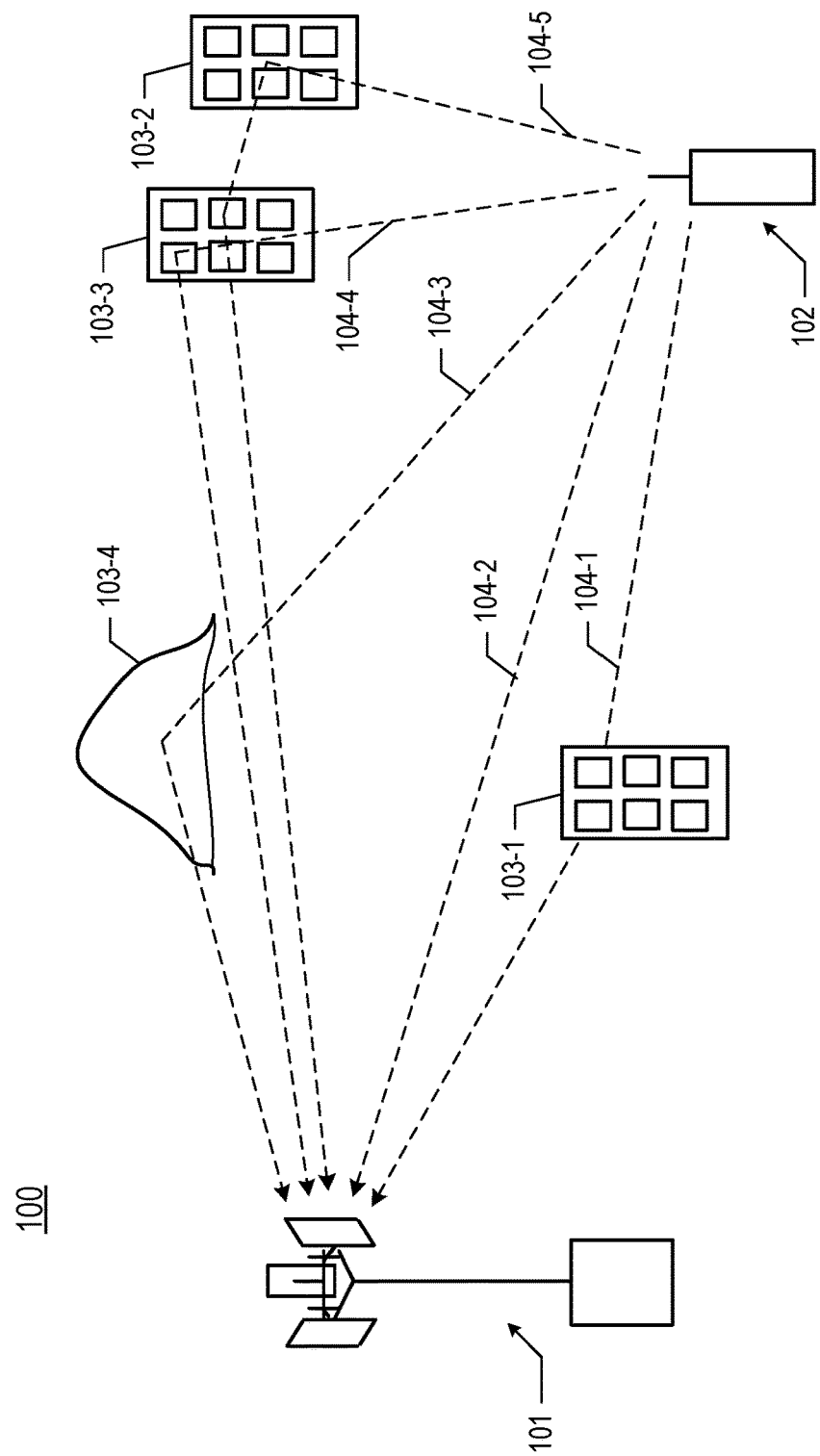
FIGS. 1A and 1B depict diagrams of the salient components of telecommunications system 100 in the prior art comprising cellular base station 101 and wireless terminal 102.
Figure 1B:
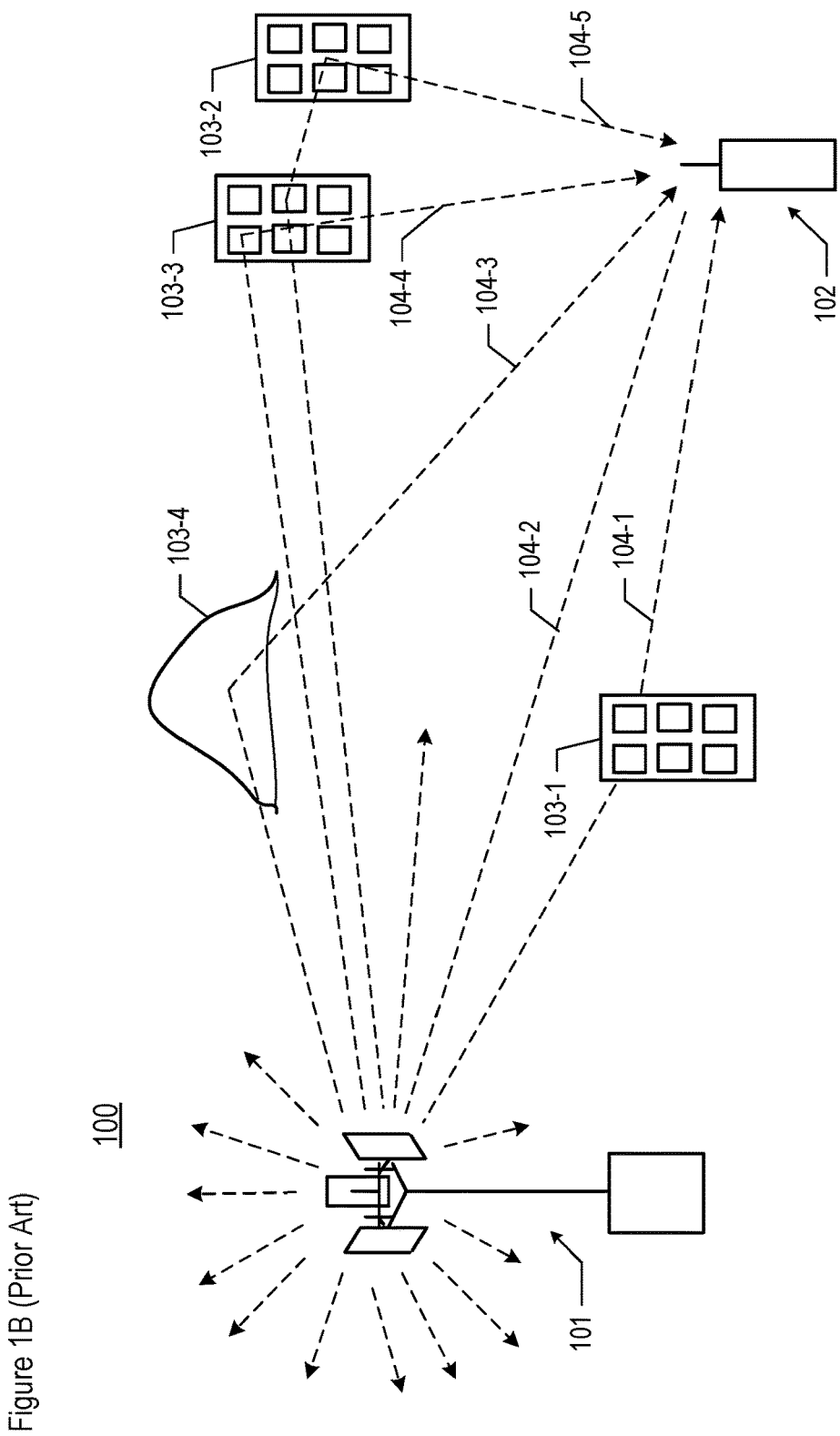

Based on—For the purposes of this specification, the phrase "based on" is defined as "being dependent on" in contrast to "being independent of". The value of Y is dependent on the value of X when the value of Y is different for two or more values of X. The value of Y is independent of the value of X when the value of Y is the same for all values of X. Being "based on" includes both functions and relations.

Bounce—For the purposes of this specification, the infinitive "to bounce" and its inflected forms (e.g., "bouncing", etc.) is defined as to cause something to move away from a surface after hitting it.

Bounding box—For the purposes of this specification, the phrase "bounding box" for a point set in N dimensions is defined as a box (e.g., a rectangle for N equal to two, a rectangular parallelepiped for N equal to three, etc.) within which all the points in the set lie. A "minimum bounding box" for a point set in N dimensions is defined as the box with the smallest measure (area for N equal to two, volume for N equal to three, or hypervolume in higher dimensions) within which all the points lie. For example and without limitation, a "point set" can represent all of the points on a surface or all of the points of a structure.

Dataset—For the purposes of this specification, the phrase "dataset" is defined as a collection of data. A dataset can originate from an organized collection of data, such as a database.

Determine—For the purposes of this specification, the infinitive "to determine" and its inflected forms (e.g., "determining", "determination", etc.) should be given the ordinary and customary meaning that the terms would have to a person of ordinary skill in the art at the time of the invention.

Edge—For the purposes of this specification, the phrase "edge" is defined as the outside limit of an object (e.g., a polygon, etc.), area, or surface.

Environment—For the purposes of this specification, the phrase "environment" is defined as the aggregate of surrounding things, conditions, and/or influences.

Establish—For the purposes of this specification, the infinitive "to establish" and its inflected forms (e.g., "establishing", etc.) should be given the ordinary and customary meaning that the terms would have to a person of ordinary skill in the art at the time of the invention.

Evaluate—For the purposes of this specification, the infinitive "to evaluate" and its inflected forms (e.g., "evaluating", "evaluation", etc.) should be given the ordinary and customary meaning that the terms would have to a person of ordinary skill in the art at the time of the invention.

Footprint—For the purposes of this specification, the phrase "footprint" is defined as the area on a surface covered by something, such as by a polyhedron that is representative of a structure in a dataset.

Height—For the purposes of this specification, the phrase "height" is defined as measurement from base to top. The height of an object, such as a polyhedron, is defined as measurement from the base of the object to the top of the object.

Multiple—For the purposes of this specification, the phrase "multiple" is defined as being more than one.

Outline—For the purposes of this specification, the phrase "outline" is defined as a line or set of lines enclosing or indicating the shape of an object.

Overlap—For the purposes of this specification, the infinitive "to overlap" and its inflected forms (e.g., "overlapping", etc.) is defined as to have an area or range in common with.

Partition—For the purposes of this specification, the infinitive "to partition" and its inflected forms (e.g., "partitioning", etc.) is defined as to divide up into parts.

Polygon—For the purposes of this specification, the phrase "polygon" is defined as a closed plane figure having at least three sides (edges). In some embodiments of the present invention, the sides are straight.

Polyhedron—For the purposes of this specification, the phrase "polyhedron" is defined as a solid in three dimensions with flat polygonal faces, straight edges and sharp corners or vertices. A "neighbor polyhedron" is defined as a polyhedron that is within a predetermined distance from another polyhedron.

Present—For the purposes of this specification, the infinitive "to present" and its inflected forms (e.g., "presenting", "presentation", etc.) should be given the ordinary and customary meaning that the terms would have to a person of ordinary skill in the art at the time of the invention.

Project—For the purposes of this specification, the infinitive "to project" and its inflected forms (e.g., "projecting", "projection", etc.) is defined as to cause something to move forward or outward. The phrase "to project to" is defined as "to project all the way to," while the phrase "to project toward" is defined as "to project in the direction of."

Ray tube—For the purposes of this specification, the phrase "ray tube" is defined as a container for rays with similar geometric properties.

Receive—For the purposes of this specification, the infinitive "to receive" and its inflected forms (e.g., "receiving", "reception", etc.) should be given the ordinary and customary meaning that the terms would have to a person of ordinary skill in the art at the time of the invention.

Structure—For the purposes of this specification, the phrase "structure" is defined as something built or constructed, such as a building, bridge, dam, or machine, for example and without limitation. For the purposes of this specification, the phrase "building" is defined as a structure with a roof and walls, such as a dwelling, house, school, store, or factory, for example and without limitation.

Surface—For the purposes of this specification, the phrase "surface" is defined as a continuous set of points that has length and breadth but no thickness.

Tile—For the purposes of this specification, the phrase "tile" is defined as a plane shape, such as certain types of polygons, used in tiling, which is a way of arranging identical plane shapes so that they completely, or at least substantially, cover an area without overlapping. For the purposes of this specification, the phrase "spawning tile" is defined as a tile that a projected ray tube can be or is bounced off of. For the purposes of this specification, the phrase "incident tile" is defined as a tile that a projected ray tube can be or is incident on.

Transmit—For the purposes of this specification, the infinitive "to transmit" and its inflected forms (e.g., "transmitting", "transmission", etc.) should be given the ordinary and customary meaning that the terms would have to a person of ordinary skill in the art at the time of the invention.

Vertex—For the purposes of this specification, the phrase "vertex" is defined as a point where two or more curves, lines, or edges meet.

Wall—For the purposes of this specification, the phrase "wall" is defined as a side of a building or room.

Figure 2:
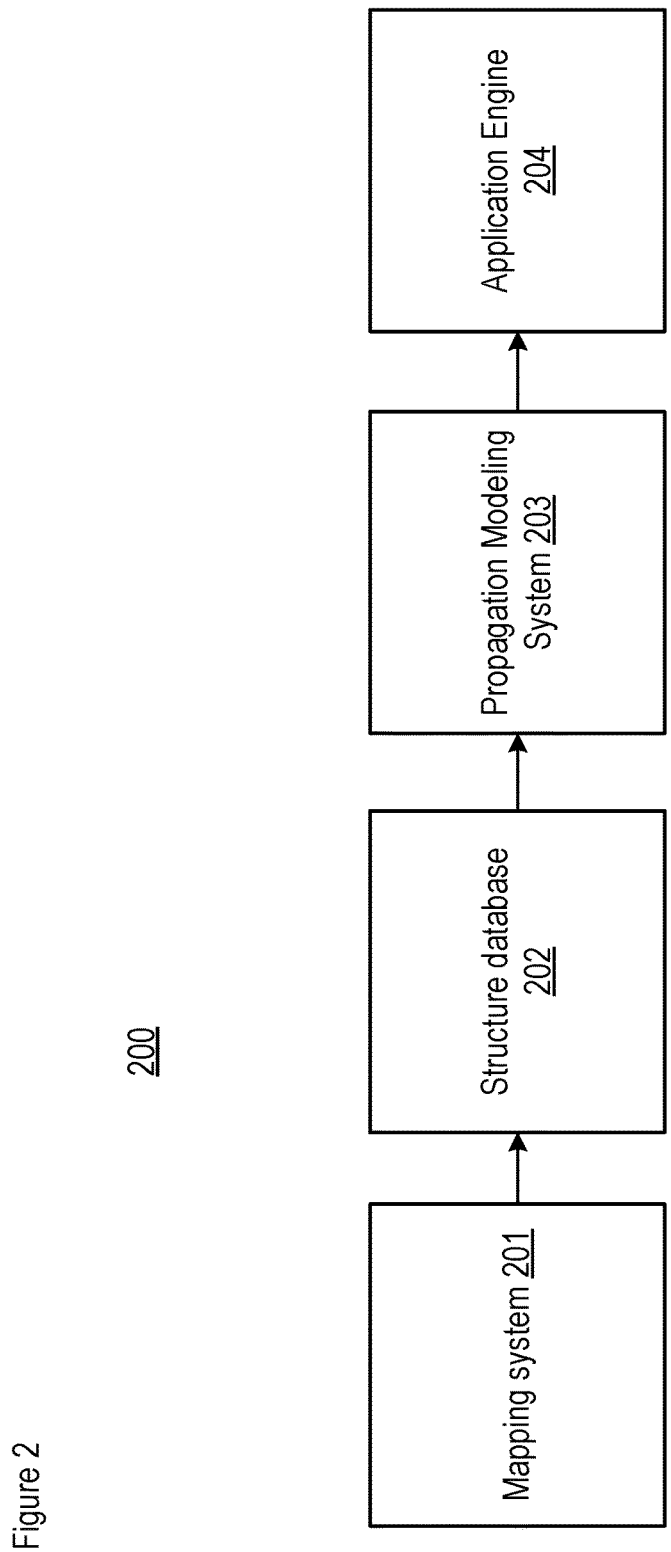
FIG. 2 depicts a diagram of the salient components of data creation and modeling system 200, in accordance with the illustrative embodiment of the present invention.

FIG. 2 depicts a diagram of the salient components of data creation and modeling system 200, in accordance with the illustrative embodiment of the present invention. Data creation and modeling system 200 comprises: mapping system 201, structure database 202, propagation modeling system 203, and application engine 204 which are interrelated as shown.

For illustrative purposes, system 200 features electromagnetic wave propagation modeling, particularly that of radio waves. As those who are skilled in the art will appreciate, however, after reading this specification, system 200 can be used for a purpose that is different than propagation modeling, including other types of modeling, simulation, prediction, and computer graphics processing. Additionally, the electromagnetic waves in the propagation modeling can be different than radio waves (e.g., heat, visible light, x-rays, gamma radiation, etc.). For example and without limitation, system 200 can be used in computer graphics processing, particularly for determining lighting and shadowing when rendering scenes, wherein visible light is the electromagnetic radiation under consideration.

Also for illustrative purposes, system 200 uses data that represents one or more buildings within an environment, in the processing of the environment data as part of electromagnetic wave propagation modeling. As those who are skilled in the art will appreciate, however, after reading this specification, the data can represent structures that are different from buildings, or can represent other objects that are representable with polyhedrons. Furthermore, the use of the data can be for a purpose that is different than propagation modeling, including other types of modeling, simulation, and prediction.

The structure data that is used by system 200 is specified in terms of polyhedrons, in which one or more polyhedrons make up each building or other type of structure. Each polyhedron, in turn, is defined by both an ordered set of vertices and a height. Each vertex in the ordered set is represented using coordinates, and the set itself defines a polygon footprint of the polyhedron being defined. Some of these types of polyhedrons are referred to as "prisms" that have a polygon footprint and vertical walls.

In particular, the type of polyhedron that is handled by system 200 in the illustrative embodiment is a "right prism." A right prism is a geometric solid that has a polygon as its base and vertical sides perpendicular to the base. As those who are skilled in the art will appreciate after reading this specification, however, at least some other types of polyhedrons that are different from right prisms can be handled by at least some of the techniques disclosed herein; such polyhedrons include oblique prisms and non-prismatic polyhedrons, for example and without limitation. Furthermore, as those who are skilled in the art will appreciate after reading this specification, at least some other types of solids in three dimensions that are different than polyhedrons can be handled by at least some of the techniques disclosed herein; such geometric solids include cylinders, cones, spheres, and tori, for example and without limitation. As a non-limiting example, the circular base of a cylinder, cone, hemisphere, or hemi-torus can be used instead of the polygonal base of a polyhedron (i.e., a "circular footprint" instead of a "polygon footprint" as described below), in some alternative embodiments of the present invention.

Mapping system 201 is responsible for the creation of structure data, in well-known fashion. System 201 features the capture of imagery of buildings and/or other terrestrial structures and details. System 201 comprises hardware and software that provides imagery over a given terrestrial surface area. The imaging devices include imaging satellites and unmanned aerial vehicles (UAV) such as macro UAVs and micro drones, for example and without limitation. Because the limitations of these sources of the structure data are well understood and quantifiable, the data itself can be characterized as being at a particular resolution of detail. Similarly, the data can be also characterized in terms of horizontal and/or vertical accuracies, in that each point (e.g., vertex, etc.) specified can deviate from its true position according to a specified accuracy.

Structure database 202 is responsible for receiving and maintaining one or more datasets of structure data, in well-known fashion. Database 202 features the organizing and storage of imagery of buildings and/or other terrestrial structures and details, in the form of polyhedrons. Database 202 comprises hardware and software that provides datasets of buildings and other structures. For example and without limitation, Database 202 can include at least a portion of a geographical information system (GIS) database as is known in the art. The type of data that can be provided to propagation modeling system 203 can comprise terrain data and building data.

Propagation modeling system 203 is responsible for propagation modeling, or for a different type of processing, using the environment data received from system 203, and the presentation of the modeling results, in accordance with the illustrative embodiment. System 203 comprises hardware and software that uses the structure data acquired from structure database 202, as described below and in the accompanying figures. In some embodiments of the present invention, system 203 operates on simplified data in which polyhedrons that represent structures in the environment have been reduced, while in some other embodiments system 203 operates on non-simplified data. System 203 is described below and with respect to FIG. 3.

In accordance with the illustrative embodiment, propagation modeling system 203 communicates with structure database 202 and application engine 204 via a local area network. It will, however, be clear to those skilled in the art, after reading this disclosure, how to make and use alternative embodiments of the present invention in which propagation modeling system 203 communicates with one or more of the entities depicted in FIG. 2 via a different network. The network can be, for example, the Internet, the Public Switched Telephone Network (PSTN), a wide area network, and so on.

Application engine 204 is responsible for applying the modeling results received from system 203, and the presentation of the results of the application, in accordance with the illustrative embodiment. As depicted, engine 204 executes on a data-processing system that comprises hardware and software. In some alternative embodiments, application engine 204 can be realized in the form of software and/or hardware within propagation modeling system 203 itself (e.g., within data-processing system 301 described below, etc.).

Figure 3:
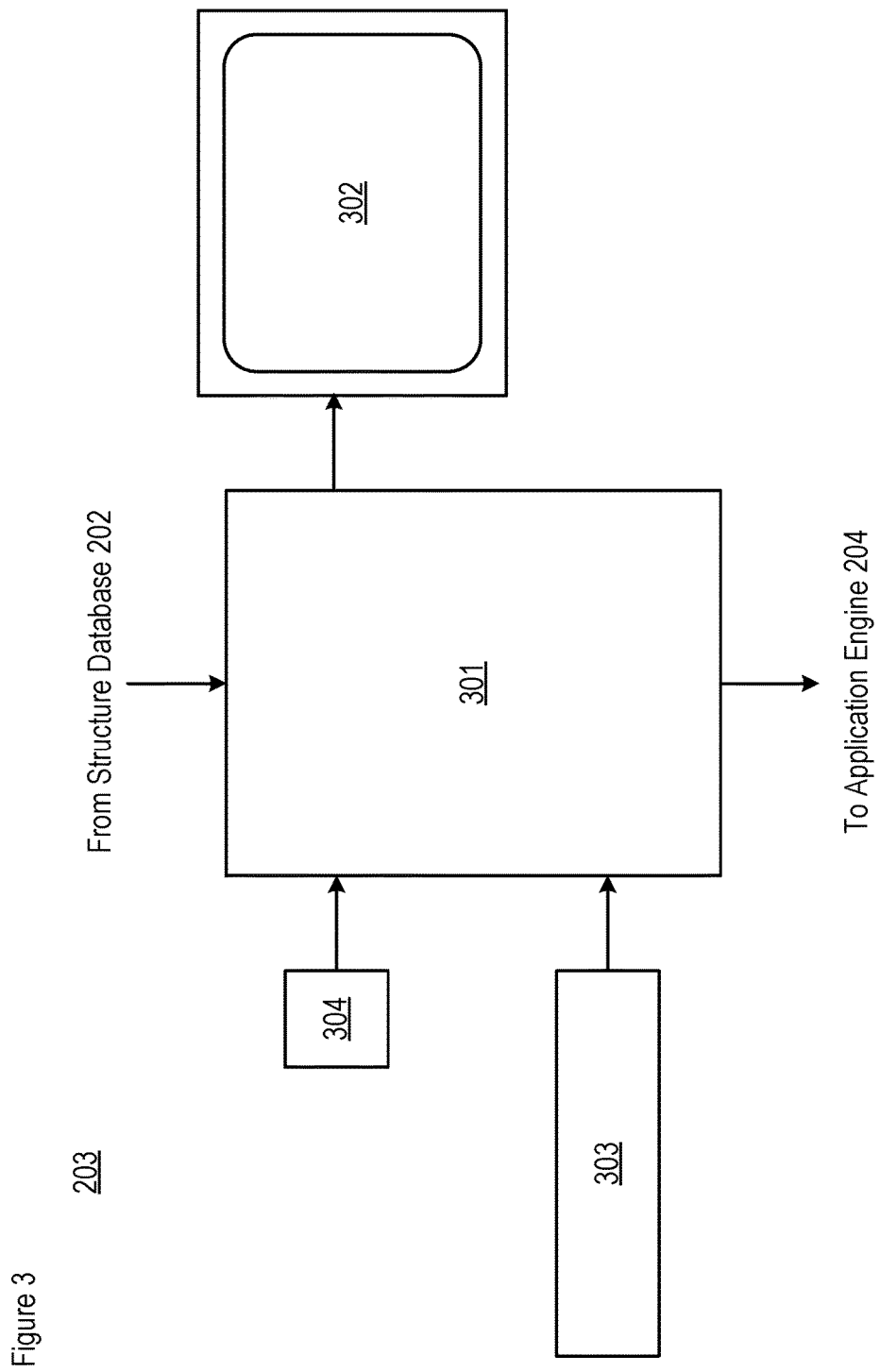
FIG. 3 depicts a block diagram of the salient components of propagation modeling system 203 within system 200.

FIG. 3 depicts a block diagram of the salient components of propagation modeling system 203, in accordance with the illustrative embodiment. Propagation modeling system 203 comprises: data-processing system 301, video display 302, keyboard 303, and pointing device 304, interconnected as shown.

Data-processing system 301 is a general-purpose computer that comprises a processor, memory, and input and output interfaces for a user interface. Data-processing system 301 is capable of performing the tasks described below. Data-processing system 301:
  i. receives one or more datasets from structure database 202, and
  iii. receives a keyboard signal from keyboard 303, comprising a user input control, and
  iii. receives a pointing and command signal from pointing device 304, comprising a user input control, and
  iv outputs a video signal to video display 302 to present results of propagation modeling, including displayable objects in the modeled environment.

Figure 4:
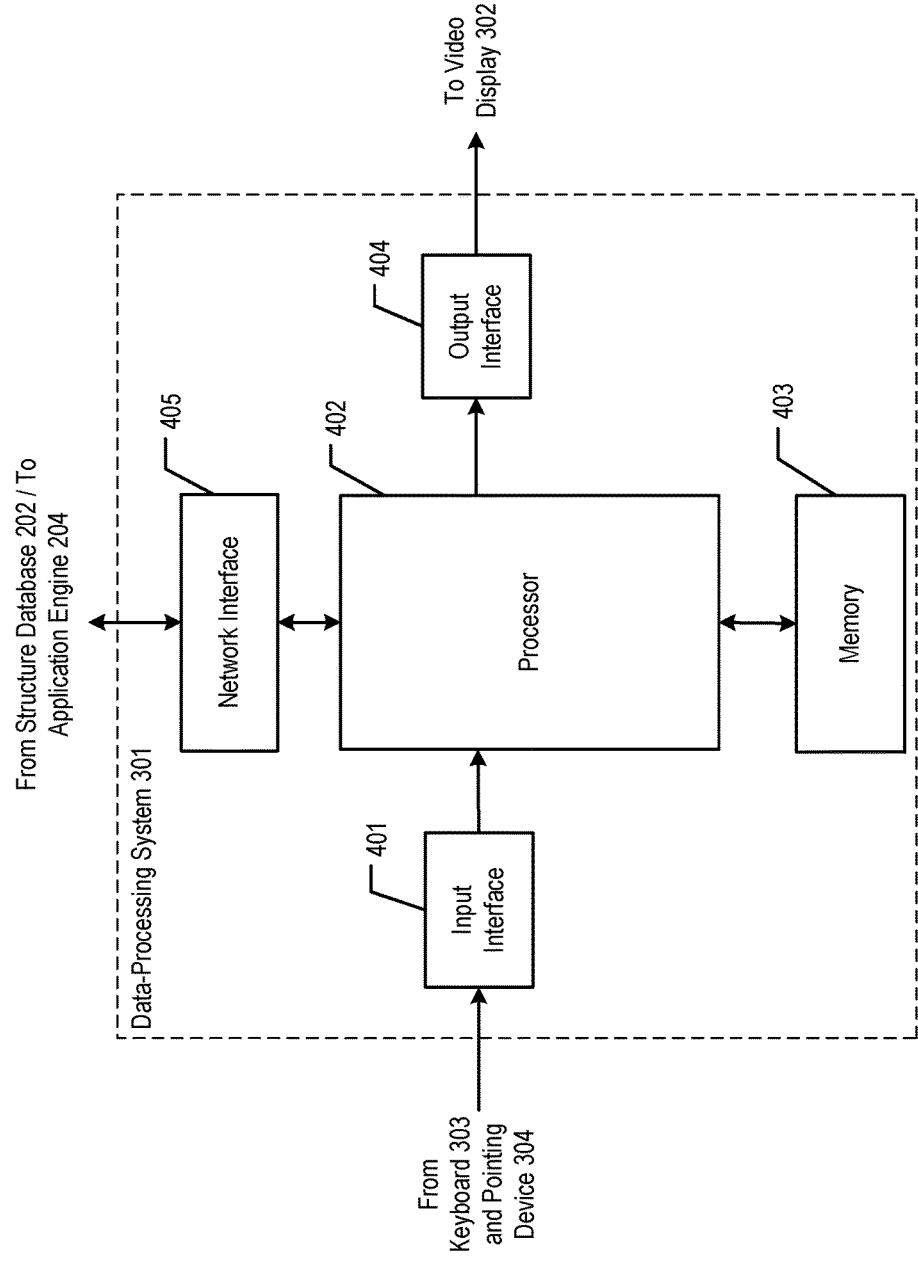
FIG. 4 depicts a block diagram of the salient components of data-processing system 301 within system 203.

Data-processing system 301 is further depicted in FIG. 4.

Video display 302 is a display device (e.g., a monitor, etc.) as is well known in the art that receives a video signal and creates a visual image of the signal for presentation to a user. In accordance with the illustrative embodiment, display 302 receives the signals that are generated as described below and presents modeling results based on the data received from system 202. It will be clear to those skilled in the art, after reading this specification, how to make and use video display 302.

Keyboard 303 is a character input device as is well known in the art that receives input from a user and transmits keyboard signals representing that input. It will be clear to those skilled in the art, after reading this specification, how to make and use keyboard 303.

Pointing device 304 is a spatial input device (e.g., a mouse, a joystick, a touchpad, a stylus, etc.) as is well known in the art that receives spatial and command (e.g., button, wheel, etc.) input from a user and that transmits pointing and command signals representing that input. It will be clear to those skilled in the art, after reading this specification, how to make and use pointing device 304.

In accordance with the illustrative embodiment, propagation-modeling system 203 performs at least some of the tasks described below. As those who are skilled in the art will appreciate after reading this specification, however, a different system can perform some or all of said tasks.

FIG. 4 depicts a block diagram of the salient components of data-processing system 301, in accordance with the illustrative embodiment. Data-processing system 301 is a computing device and comprises input interface 401, processor 402, memory 403, output interface 404, and network interface 405 interconnected as shown. In accordance with the illustrative embodiment, data-processing system 301 is a personal computer.

Input interface 401 receives signals from keyboard 303 and pointing device 304, and forwards the information encoded in the signals to processor 402. It will be clear to those skilled in the art, after reading this specification, how to make and use input interface 401.

Processor 402 is a general-purpose processor that is capable of: receiving information from input interface 401; reading data from and writing data into memory 403; executing at least some of the tasks described below; and transmitting information to output interface 404. In some alternative embodiments of the present invention, processor 402 might be or might comprise a special-purpose processor, such as a graphics-processing unit (GPU). In either case, it will be clear to those skilled in the art, after reading this specification, how to make and use processor 402.

Memory 403 stores data and executable instructions, is a combination of volatile and non-volatile memory, and is non-transitory. It will be clear to those skilled in the art, after reading this specification, how to make and use memory 403.

Output interface 404 receives information from processor 402, and outputs signals that encode this information to video display 302. In some embodiments, output interface 404 can be built into a video card, which can be used to offload at least some of the processing from processor 402. It will be clear to those skilled in the art, after reading this specification, how to make and use output interface 404.

Network interface 405 receives one or more datasets from structure database 202. In some alternative embodiments of the present invention, the datasets are made available to data-processing system 301 through other means. It will be clear to those skilled in the art, after reading this specification, how to make and use network interface 405.

As those who are skilled in the art will appreciate after reading this specification, the hardware platform performing at least some of the tasks performed by data-processing system 301 can be embodied as a multi-processor platform, as a sub-component of a larger computing platform, as a virtual computing element, or in some other computing environment—all within the scope of the present invention. The steps described herein can be performed in a single processor, or distributed across multiple processors. Furthermore, data-processing system 301 can be a type of apparatus different than a personal computer, such as a server computer, and can be referred to by a different name such as a computer system, a computing device, or another type of hardware platform that comprises one or more processors, one or more memories, and one or more network interfaces, for example and without limitation.

Figure 5:
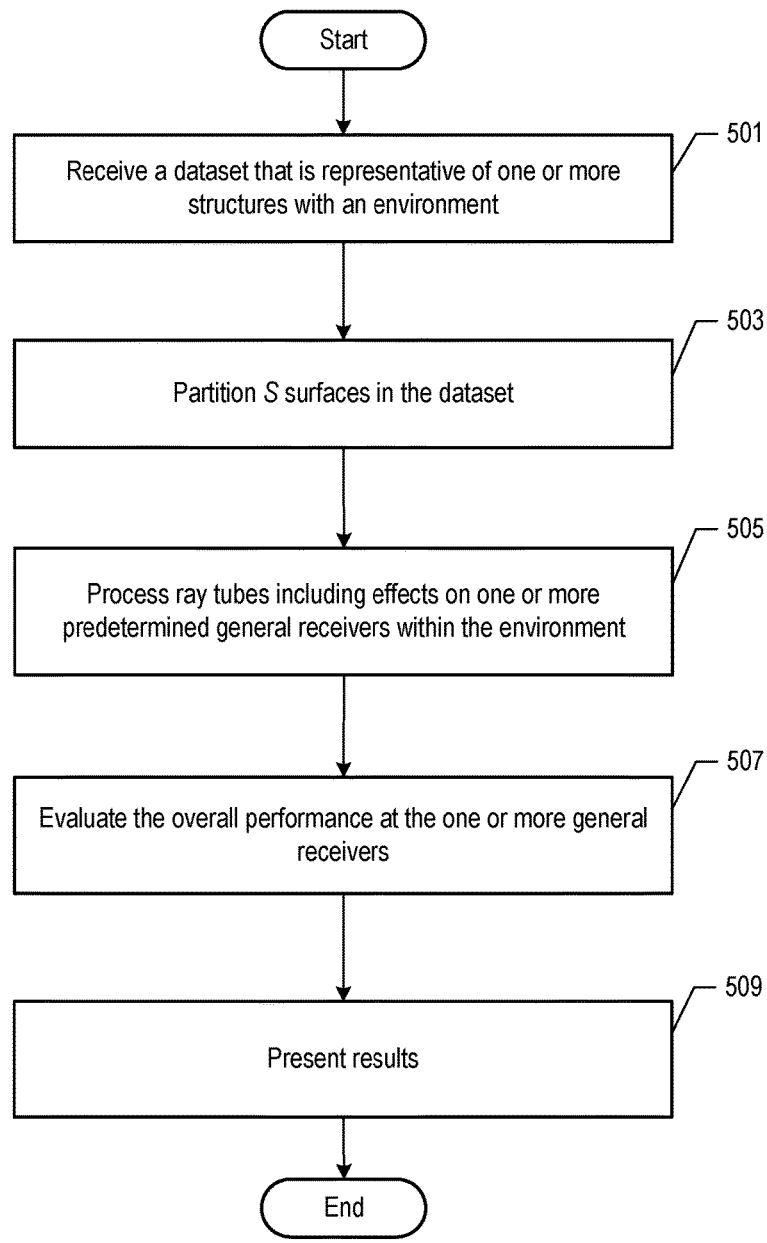
FIG. 5 depicts a flowchart of the salient processes of method 500, in accordance with the illustrative embodiment.

FIG. 5 depicts a flowchart of the salient processes of method 500 for performing ray launching, performed in accordance with the illustrative embodiment and comprising operations that are depicted in a particular order. It will be clear to those having ordinary skill in the art, after reading the present disclosure, how to make and use alternative embodiments of method 500, as well as the other methods disclosed in this specification, wherein the recited operations sub-operations, and messages are differently sequenced, grouped, or sub-divided—all within the scope of the present disclosure. It will be further clear to those skilled in the art, after reading the present disclosure, how to make and use alternative embodiments of the disclosed methods wherein some of the described operations, sub-operations, and messages are optional, are omitted, or are performed by other elements and/or systems.

For pedagogical purposes, the operations associated with the disclosed system and method are presented as being sequentially performed. As those who are skilled in the art will appreciate after reading this specification, at least some of the operations disclosed herein can be performed in parallel with one another. For example and without limitation, the processing that is associated with a given tile or a given ray can be performed concurrently for multiple tiles or multiple rays, respectively.

The propagation modeling techniques disclosed in FIG. 5 and related figures are depicted as being performed by data-processing system 301 within propagation modeling system 203. As those who are skilled in the art will appreciate after reading this specification, however, these disclosed techniques can be performed elsewhere.

In accordance with operation 501, data-processing system 301 receives dataset 600, which is described below and is representative of one or more structures within an environment. Each structure can be defined by one or more polyhedrons, each of which having a footprint defined by a polygon (i.e., a "polygon footprint"). Each polygon, in turn is made up of vertices and edges. In some embodiments of the present invention, the dataset is characterized as having a predetermined error. The predetermined error can be characterized in terms of a particular resolution in the data (e.g., 1 meter, 2 meters, 5 meters, 6 meters, 10 meters, 15 meters, 20 meters, 25 meters, 30 meters, etc.), a particular accuracy in terms of how each vertex point has been specified horizontally and/or vertically in relation to its true position, or something else.

Figure 6:
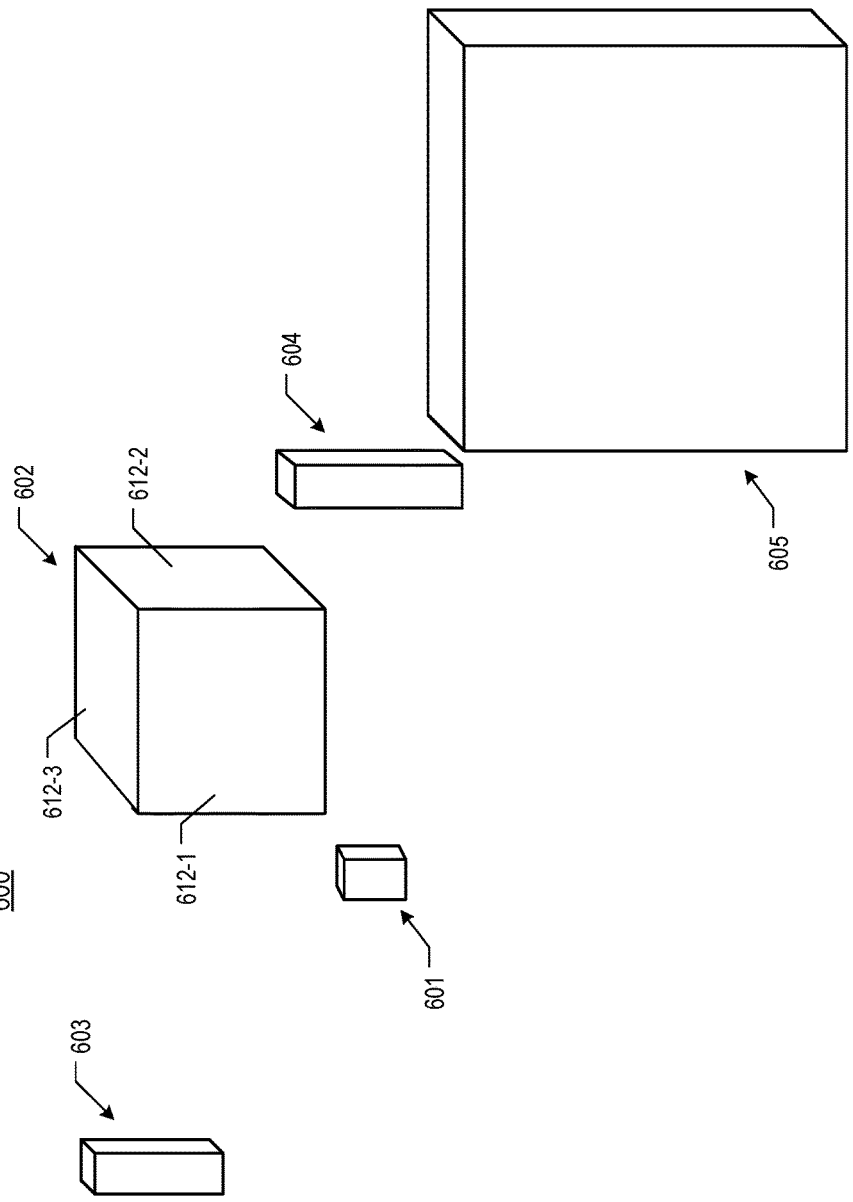
FIG. 6 depicts a visualization of dataset 600.

FIG. 6 depicts a visualization of dataset 600. Dataset 600 is representative of one or more structures within an environment, including structures 601 through 605. Each structure in dataset 600 is defined as having one or more surfaces (e.g., a first surface, a second surface, etc.). For example, the surfaces of structure 602 that are visible as depicted are surfaces 612-1, 612-2, and 612-3. In turn, each surface can be partitioned mathematically into one or more tiles, as described below and in regard to FIG. 8.

Each structure can be defined in dataset 600 in terms of one or more polyhedrons, wherein each polyhedron is defined in part as having a polygon footprint. As those who are skilled in the art will appreciate after reading this specification, however, footprints of at least some other types of plane figures (e.g., circles, etc.) that correspond to least some other types of geometric solids different than polyhedrons can be handled by at least some of the techniques disclosed herein. Moreover, such footprints can be defined in dataset 600 by features other than vertices, as those who are skilled in the art will appreciate after reading this specification; for example, a circle can be defined by its center point and radius.

In accordance with the illustrative embodiment, the two vertices in the lower corners of the wall and a height component define a vertical wall of a polyhedron. As those who are skilled in the art will appreciate after reading this specification, however, the two vertices in the upper corners can be used along with a height component.

In accordance with the illustrative embodiment, structures 601 through 605 are buildings, wherein each of the buildings comprises multiple exterior sides. As those who are skilled in the art will appreciate after reading this specification, however, one or more structures represented in dataset 600 can be structures other than buildings (e.g., free-standing walls, bridges, machines, objects for transporting other objects, natural objects, etc.). For each structure that is a building, each surface is defined by a corresponding, exterior side of the building.

In accordance with operation 503, data-processing system 301 initializes at least some of the data used in performing ray launching, including partitioning mathematically S surfaces in the dataset. Operation 503 is described below and in regard to FIG. 7.

In accordance with operation 505, data-processing system 301 processes ray tubes, including projecting one or more ray tubes in accordance with the illustrative embodiment. In some embodiments of the present invention, each ray tube is defined by a corresponding tile toward which the ray tube is projected. As part of operation 505, system 301 processes the effects of one or more of the ray tubes on one or more predetermined general receivers, or other receive points, within the environment being modeled. Operation 505 is described below and in regard to FIG. 11.

In accordance with operation 507, data-processing system 301 evaluates the overall performance experienced, in terms of signal strength (e.g., ray power, etc.) at the one or more predetermined receive points within the environment being modeled. In particular, system 301 can evaluate an incidence of bounced ray tubes at the one or more receive points within the environment, wherein at least one of the bounced ray tubes is based on (e.g., is traceable to, etc.) at least one of the ray tubes projected in accordance with operation 505, for one or more sets of projected ray tubes. For example and without limitation, evaluating such an incidence can amount to combining each result of operation 1103 for a given receive point, which is described below and in regard to FIG. 11, and doing so for one or more of the receive points. System 301 determines an overall performance value or values for the receive point based on the one or more intermediate results accumulated in operation 1103. For example and without limitation, system 301 can add the intermediate results, or values based on the intermediate results, together and treat the sum as the overall result for the receive point being considered.

In accordance with the illustrative embodiment, data-processing system 301 evaluates performance in regard to signal strength. However, as those who are skilled in the art will appreciate after reading this specification, system 301 can evaluate the performance experienced at one or more of the given receive points in terms of other signal characteristics such as propagation delay, for example and without limitation. In some alternative embodiments of the present invention, system 301 can instead evaluate a performance characteristic (e.g., signal strength, propagation delay, etc.) directly related to or experienced at one or more of the tiles themselves.

In accordance with operation 509, data-processing system 301 presents the result or results obtained at operation 507. For example and without limitation, system 301 can present a propagation result that is based on the evaluating performed in accordance with operation 507.

In some embodiments of the present invention, system 301 presents (e.g., displays, etc.) the result to a user via display 302. In some other embodiments of the present invention, system 301 transmits the results to application engine 204. In some embodiments of the present invention, system 301 in essence "transmits" the data by making it available to a software process used to implement the processing associated with application engine 204. Engine 204 can take the result and, based on the result, modify an engineering parameter (e.g., a radio frequency [RF] parameter, etc.) that affects the environment, which can provide an improvement in a wireless telecommunication network's ability to handle wireless traffic within the environment.

Figure 7:
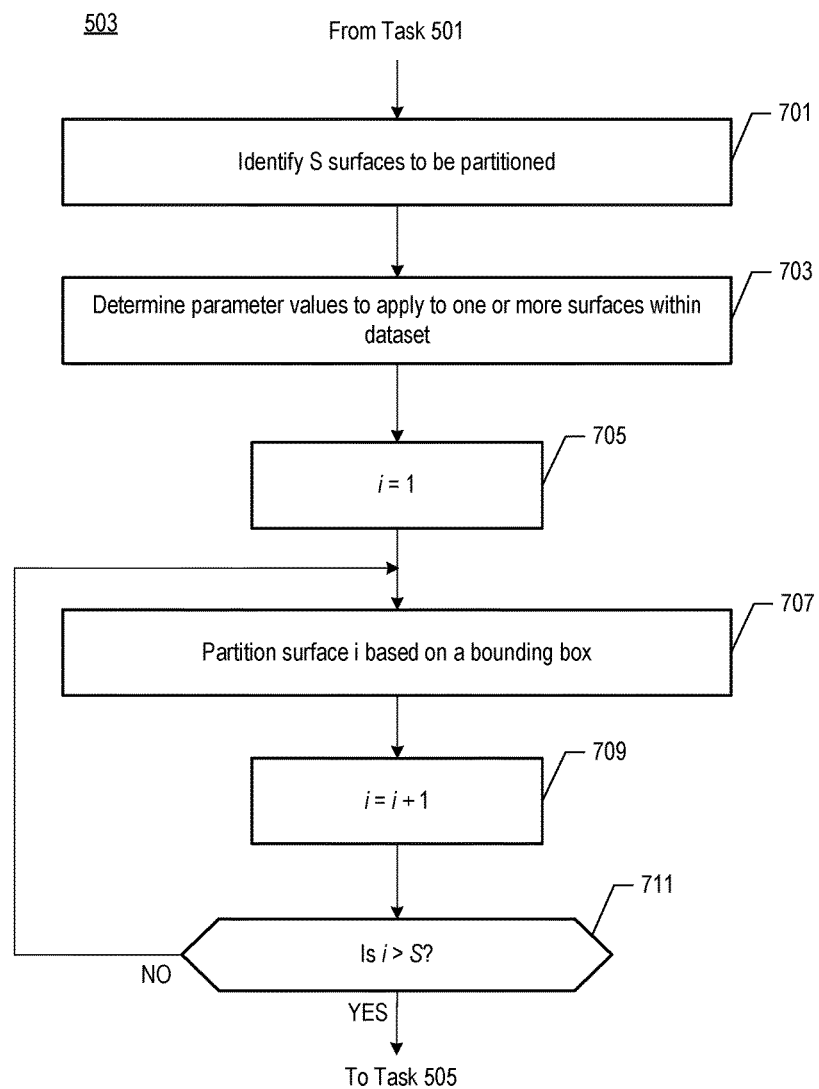
FIG. 7 depicts operation 503 of method 500, related to initializing at least some of the data used for ray launching.

FIG. 7 depicts operation 503, related to initializing at least some of the data used for ray launching. In accordance with the illustrative embodiment, data-processing system 301 partitions mathematically (i.e., "tiles") one or more surfaces (e.g., walls, roofs, etc.) of structures 601 through 605 into one or more sets of tiles. In partitioning the surfaces of the structures into tiles, it can be said that data-processing system 301 "discretizes" the surfaces. In some embodiments of the present invention, system 301 can partition other surfaces of other features within dataset 600 such as some or all of the ground surrounding the structures or elsewhere throughout dataset 600. Furthermore, the surfaces that are partitioned on the ground or on other features can be processed in the same way as the surfaces that are partitioned on structures, as disclosed herein.

In accordance with operation 701, data-processing system 301 identifies S surfaces to be partitioned in dataset 600. For example and without limitation, system 301 can identify all of the surfaces represented in dataset 600, the surfaces in a specific region represented in the dataset, or some other subset of surfaces represented in the dataset.

In accordance with operation 703, data-processing system 301 determines parameter values to apply for each surface to be partitioned. For example and without limitation, some or all of operation 801 can be performed here.

Data-processing system 301 initializes index i to one at operation 705. In accordance with operation 707, system 301 partitions surface i. Operation 707 is described below and in regard to FIG. 8.

Data-processing system 301 increments index i. In accordance with operation 711, if i is greater than S, control of task execution proceeds to operation 505. Otherwise, control of task execution proceeds back to operation 707, in order to process the next surface.

Figure 8:
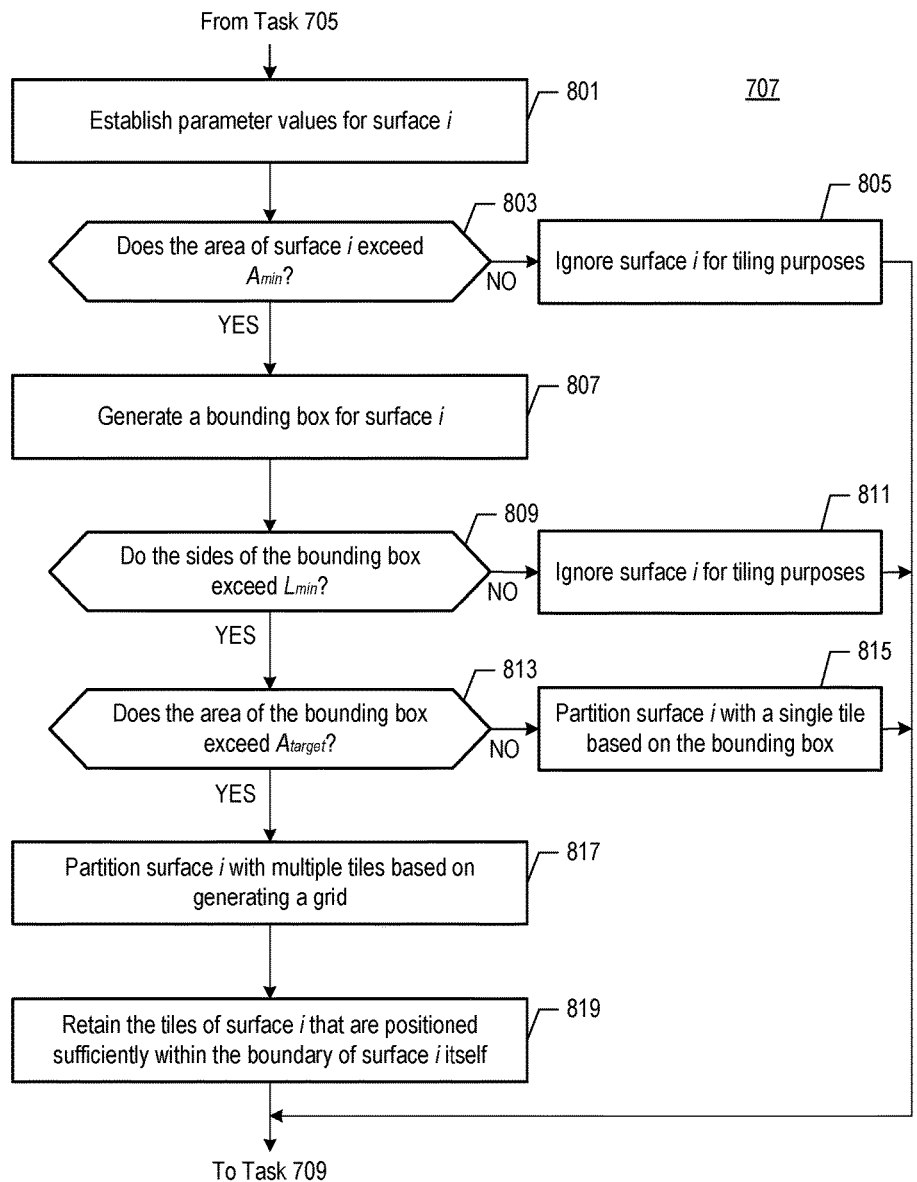
FIG. 8 depicts operation 707, related to partitioning a surface of a structure in dataset 600.

FIG. 8 depicts operation 707, related to partitioning surface i. In accordance with operation 801, data-processing system 301 establishes parameter values that apply to surface i, for the parameters of minimum length, $L_{min}(i)$; minimum area, $A_{min}(i)$; target area, $A_{target}(i)$; and target length, $L_{target}(i)$. In other words, for a given surface i, these parameters are referred to as $L_{min}(i)$, $A_{min}(i)$, $A_{target}(i)$, and $L_{target}(i)$, respectively, wherein each of these parameters can have different values across different values of i.

Minimum length, $L_{min}(i)$ represents the minimum length of a side of surface i. $L_{min}(i)$ can be used to avoid having tiles that are overly narrow. In some embodiment of the present invention, the numeric value of $L_{min}(i)$ can depend on the wavelength of the electromagnetic wave being modeled. In some other embodiments of the present invention, the value of $L_{min}(i)$ can be set to a particular value (e.g., 0.5 meter, 0.3 meter, etc.).

Minimum area, $A_{min}(i)$ represents the minimum area of surface i. $A_{min}(i)$ can be a function of $L_{min}(i)$. In some embodiments of the present invention, $A_{min}(i)$ is equal to the square of $L_{min}(i)$.

Target area, $A_{target}(i)$ represents an objective as to the area of a tile. In general, a smaller value of $A_{target}(i)$ can improve the accuracy of a modeling run by increasing the number of tiles into which surface i is partitioned, and a larger value of $A_{target}(i)$ can result in a shorter runtime in the modeling run by decreasing the number of tiles into which surface i is partitioned.

Target length, $L_{target}(i)$ represents an objective as to the length of a side of a tile.

Two or more surfaces represented in dataset 600 can have the same parameter value or values, or they can have a different parameter value or values. In some embodiments of the present invention, one or more of the aforementioned parameters can have values that are based on the different surfaces of the same structure or object, based on the different structures or objects, based on the location of the surfaces (e.g., in relation to a predetermined point such as a transmitter, their geographic coordinates, etc.), based on the type of object being partitioned (e.g., structure, wall, roof, ground, etc.). For example and without limitation, $A_{target}(i)$ can have a value that is based on surface i's position in relation to a transmitter (e.g., smaller value closer to transmit point, larger value farther from transmit point, etc.).

In some embodiments of the present invention, the values for one or more parameters of surface i that is being current processed can be based on the values for one or more parameters of a previously processed surface.

In accordance with operation 803, data-processing system 301 determines if the area of surface i exceeds $A_{min}(i)$ (e.g., is greater than, is greater than or equal to, etc.). If the area does exceed $A_{min}(i)$, control of task execution proceeds to operation 807. If not, control of task execution proceeds to operation 805.

In accordance with operation 805, data-processing system 301 ignores surface i for tiling purposes. For example and as depicted in FIG. 6, for some values of $A_{min}(i)$, one or more of the surfaces of structure 601 are to be ignored by system 301 for tiling purposes, while one or more of the surfaces of structure 602 are not. In other words, surface i does not have a large enough area to make a significant enough difference in regard to any bouncing of any ray tube off of the surface; consequently, the surface will not be tiled. In some embodiments of the present invention, surface i is still considered in regard to other processing, such as visibility processing, and as described below and regarding operations 1101 and 1109. After operation 805, control of task execution proceeds to task 709.

In accordance with operation 807, data-processing system 301 generates (e.g., creates, etc.) a bounding box for surface i. The bounding box is representative of the surface. In some embodiments of the present invention, the bounding box is a minimum bounding box. In some other embodiments of the present invention, something other than a bounding box is used to represent surface i for the purposes of the processing that is to follow.

Figure 9:
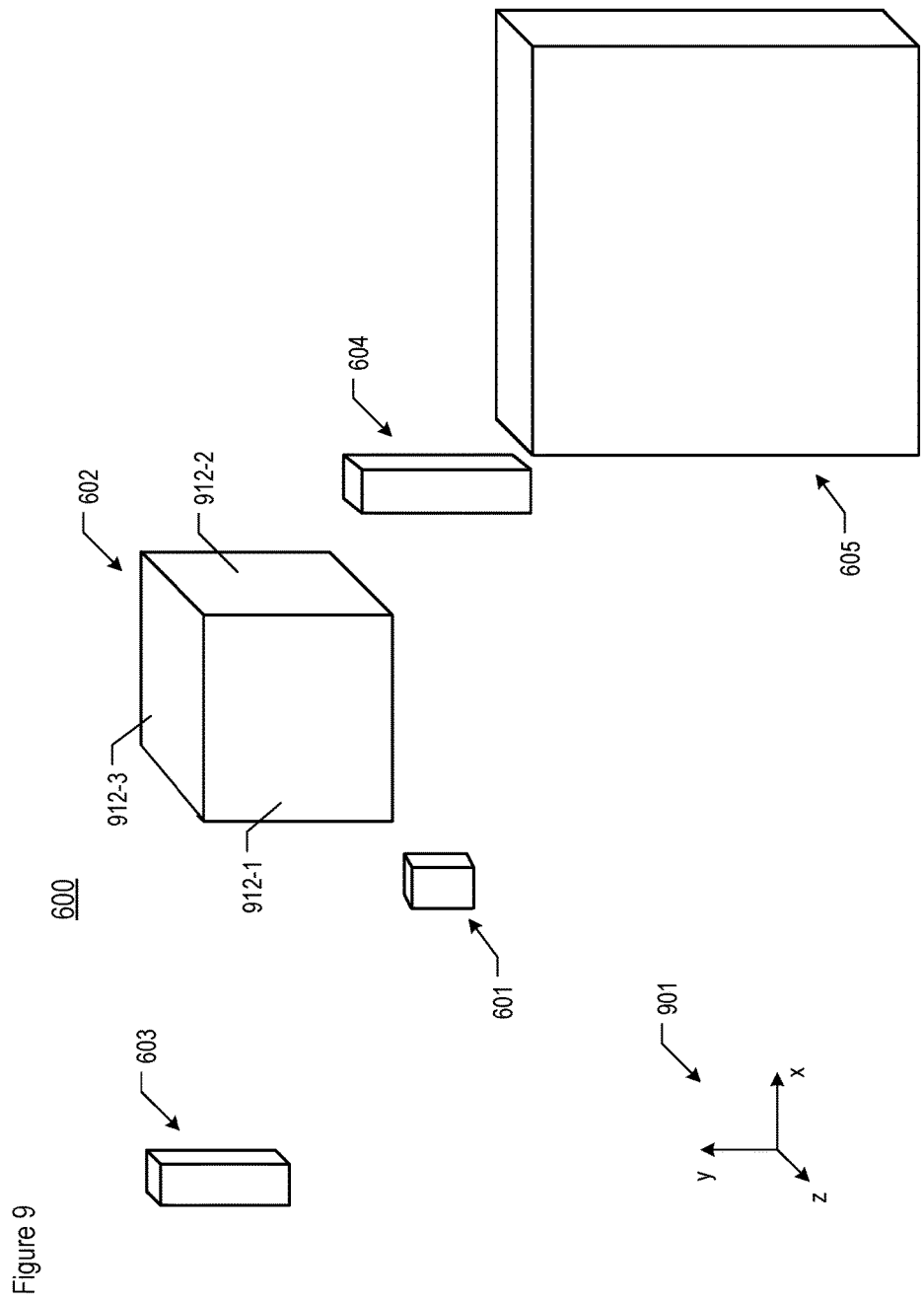
FIG. 9 depicts the surfaces of structure 602 that are visible in the figure as having minimum bounding boxes 912-1, 912-2, and 912-3.

As depicted in FIG. 9, the surfaces of structure 602 that can be seen in the figure have minimum bounding boxes 912-1, 912-2, and 912-3. For example, bounding box 912-1 generated for surface 612-1 has dimensions $L_x$ and $L_y$, and is axis-aligned with respect to the Cartesian coordinate axes (x,y) of coordinate system 901 of dataset 600 (i.e., the "local axes" of dataset 600), wherein the x-axis is oriented horizontally and the y-axis is oriented vertically.

Although the bounding boxes depicted in FIG. 9 are axis-aligned to a Cartesian coordinate system, in some alternative embodiments of the present invention one or more bounding boxes can be axis-aligned to a different coordinate system than Cartesian. In some other alternative embodiments, one or more of the bounding boxes can be oriented in a way that is different from being axis-aligned to a coordinate system of a dataset, wherein at least some of the bounding boxes can be oriented independently of one another.

In some embodiments of the present invention, a bounding box can be oriented based on the outline of its corresponding surface. For example, the bounding box can be oriented based on the outline of the exterior side of a building that defines the corresponding surface of the building, or other structure. For example and without limitation, if the outline of an exterior side of a building has a longest dimension that is oriented at an oblique angle relative to the vertical orientation depicted in FIG. 9, then the bounding box generated for that surface can be created with an orientation according to the oblique angle of the surface.

Alternatively, an orientation of a bounding boxes can be established such that the number of tiles to be generated later for a surface is attempted to be minimized and/or constrained to a predefined target amount. Depending on the surface, this might be accomplished by orienting the bounding box according to the outline of the surface or by orienting the bounding box in some other way.

In accordance with operation 809, data-processing system 809 determines whether the sides of the bounding box exceed $L_{min}(i)$. If they do not exceed $L_{min}(i)$, then control of task execution proceeds to operation 811. Otherwise, control of task execution proceeds to operation 813. Although a similar check is performed in accordance with operation 803 in regard to the area of the surface itself, the current check is performed in regard to the dimensions of the bounding box, in order to avoid the partitioning of surfaces that are too narrow.

In accordance with operation 811, data-processing system 301 ignores surface i for tiling purposes. In some embodiments of the present invention, surface i is still considered in regard to other processing, such as visibility processing, and as described below and regarding operations 1101 and 1109. After operation 811, control of task execution proceeds to task 709.

In accordance with operation 813, data-processing system 301 determines if the area of the bounding box for surface i exceeds $A_{target}(i)$ (e.g., is greater than, is greater than or equal to, etc.). If the area does exceed $A_{target}(i)$, control of task execution proceeds to operation 817. If not, control of task execution proceeds to operation 815.

In accordance with operation 815, data-processing system 301 partitions surface i with a single tile that is based on the bounding box of that surface. In some embodiments of the present invention, the single tile is essentially coincident with and essentially has the same dimensions as the bounding box of surface i. After operation 815, control of task execution proceeds to task 709.

In accordance with operation 817, data-processing system 301 partitions surface i with multiple tiles. This can be accomplished, in some embodiments of the present invention, by generating a grid based on the bounding box and determining the columns and rows in the grid. The number of columns, $N_{col}$ and the number of rows, $N_{row}$ that describe the grid generated from bounding box 912-1, for example, can be determined based on the following equations:

$$N_{col} = \max(\text{round}(L_x/L_{target}), 1), \text{ and} \qquad \text{(equation 1)}$$

$$N_{row} = \max(\text{round}(L_y/L_{target}), 1), \qquad \text{(equation 2)}$$

wherein each intersection of each column and each row defines a tile, and wherein $L_{target}$ in this example is for surface 612-1.

In some alternative embodiments of the present invention, instead of using $L_{target}(i)$ as the tile target length for both dimensions of the bounding box, data-processing system 301 can first partition across a first dimension, such as the x-axis, then calculate a tile target length for the second dimension, in this case the y-axis, and then partition across the second dimension based on the calculated target length for that second dimension. For example and without limitation, the target length for the second dimension can be calculated based on an objective of conforming the tiles to essentially a square shape, or to a "square-like" shape in which the ratio of longest dimension to shortest dimension does not exceed a predefined amount (e.g., 1.1, 1.2, 1.5, etc.). As before, each intersection of each column and each row defines a tile.

Figure 10:
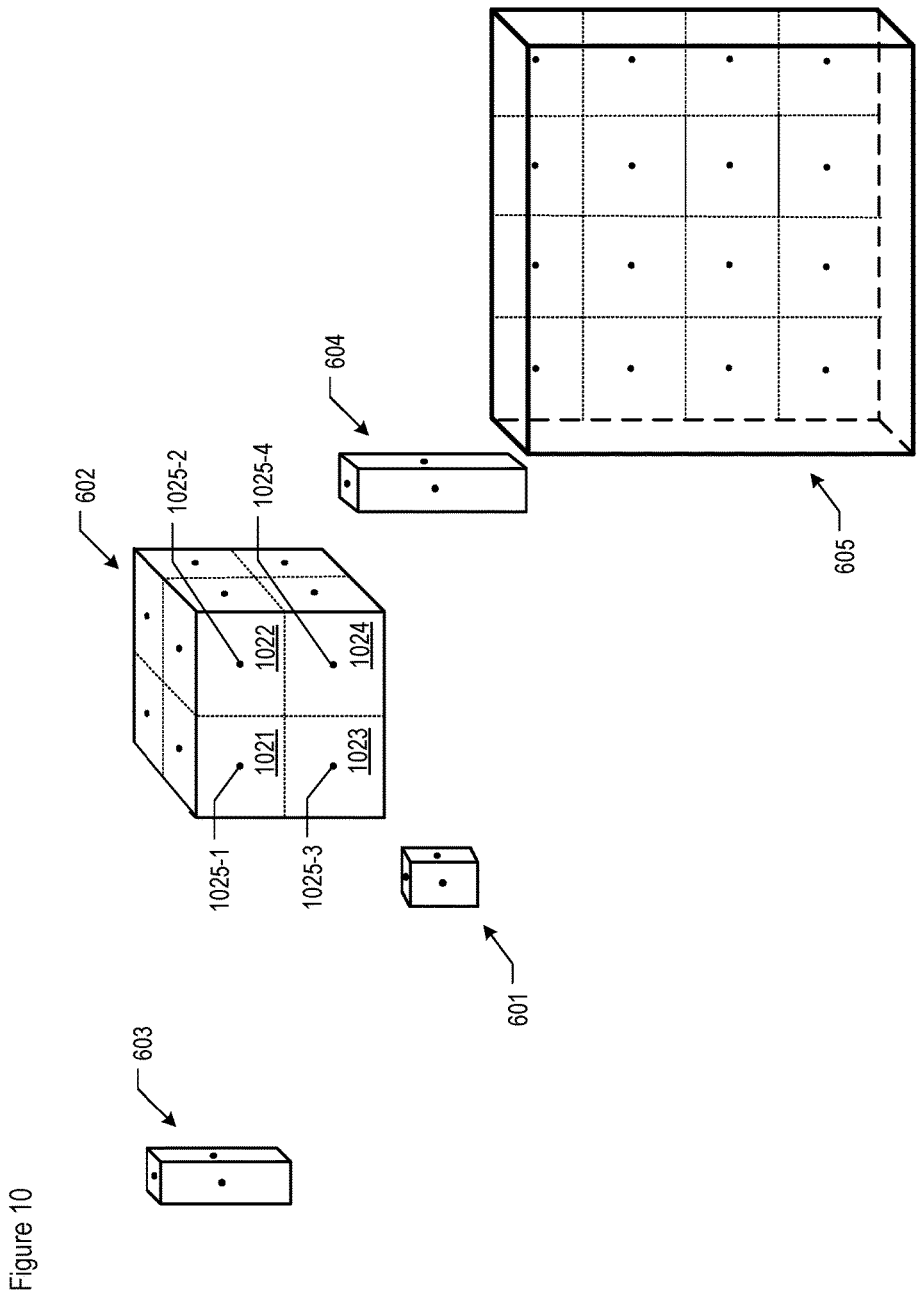
FIG. 10 depicts at least some of the surfaces of some of structures 601 through 605 as being partitioned into at least one tile per surface.

As can be seen in FIG. 10, at least some of the surfaces of some of structures 601 through 605 are partitioned into at least one tile per surface. As discussed earlier, given the value of $A_{min}(i)$ used in the example, one or more of the surfaces of structure 601 are not partitioned by data-processing system 301. Structure 602, a building, as depicted is partitioned into four tiles per each surface that can be seen in the drawing, including i) tiles 1021 through 1024 that are part of the same exterior side (or wall) of the building and ii) another set of tiles that are part of the roof of the building.

Each tile in the partitioning is created to have a particular shape. For example and without limitation, each of tiles 1021 through 1024 has a square shape. There are other tiles depicted in FIG. 10 as having a non-square, rectangular shape. As those who are skilled in the art will appreciate after reading this specification, the created tiles can have a shape that is one of a different type of polygon such as a regular triangle and a regular hexagon, for example and without limitation.

In some embodiments of the present invention, the shape of one or more tiles can be based on the outline of the exterior side of a building that defines the corresponding surface of the building, or other structure. For example and without limitation, if the outline of an exterior side of a building is described by a particular set of contours over which the tiles of a first shape, such as a triangle, would overlap better than the tiles of a second shape, such as a rectangle, then the tiles created during the partitioning of that surface can be created in the first shape. Tiles on different surfaces and/or structures can have different shapes that are based on respective outlines of the different surfaces and/or structures, or the tiles on the different surfaces and/or structures can all be the same shape.

In accordance with the illustrative embodiment, all of the tiles of a given surface have the same shape; such tiles can be more easily represented in a computer memory (e.g., by a single set of dimensions or characteristics that describes more than one tile, etc.). In some embodiments of the present invention, however, different tiles of a given surface can have different shapes. In accordance with the illustrative embodiment, the tiles of a first surface are of one shape, whereas the tiles of a second surface (e.g., of the same structure, of a different structure, etc.) are of a different shape than that of the tiles on the first surface. In some embodiments of the present invention, however, the tiles of two different surfaces (e.g., on the same building, on two different buildings, etc.) can be of the same shape.

In regard to the surface area of a tile, in accordance with the illustrative embodiment, all of the tiles of a given surface have substantially the same amount of area (e.g., within one percent of each other, etc.). In some embodiments of the present invention, however, different tiles of a given surface can have substantially different amounts of areas (e.g., greater than one percent difference, etc.). In accordance with the illustrative embodiment, the tiles of two different surfaces (e.g., on the same building, on two different buildings, etc.) can have substantially the same amount of area. In some embodiments of the present invention, however, the tiles of a first surface are of one amount in area, whereas the tiles of a second surface (e.g., of the same structure, of a different structure, etc.) are of a different amount in area than that of the tiles on the first surface.

In some embodiments of the present invention, the partitioning performed in accordance with operation 817 comprises determining a set of tiles that sufficiently overlap surface i. For example, this can be determined by checking that a predefined reference point in each tile of the bounding box lies within surface i. As is also shown in FIG. 10, each tile created in the partitioning of each surface has such a reference point at a predefined position within the tile. For example, tiles 1021 through 1024 have reference points 1025-1 through 1025-4, respectively. In accordance with the illustrative embodiment, each reference point depicted is a center point at the center of the tile. The center of the tile can be defined, for example, as being substantially equidistant (e.g., with one percent of the theoretical equidistant point, etc.) from each vertex of the particular regular polygon that is the shape of the tile.

In some embodiments of the present invention, data-processing system 301 can determine the set of tiles that sufficiently overlap the surface i, by considering multiple, distinct reference points instead of a single reference point, for at least some of the tiles of the bounding box (e.g., all tiles, tiles around the edge of the box, etc.). For example and without limitation, this can be determined by checking that at least one reference point in each tile of the bounding box lies within surface i, or by checking that at least N reference points lie within the surface (e.g. N equals two, N equals three, etc.), or by checking that all reference points lie within the surface, in order to conclude that a tile sufficiently overlaps the surface.

In accordance with operation 819, data-processing system 301 retains the tiles of surface i that are positioned sufficiently within the boundary of surface i itself (i.e., sufficiently overlap the surface). Control of task execution then proceeds to operation 709, in which only the retained tiles are used in the projecting of one or more ray tubes.

Figure 11:
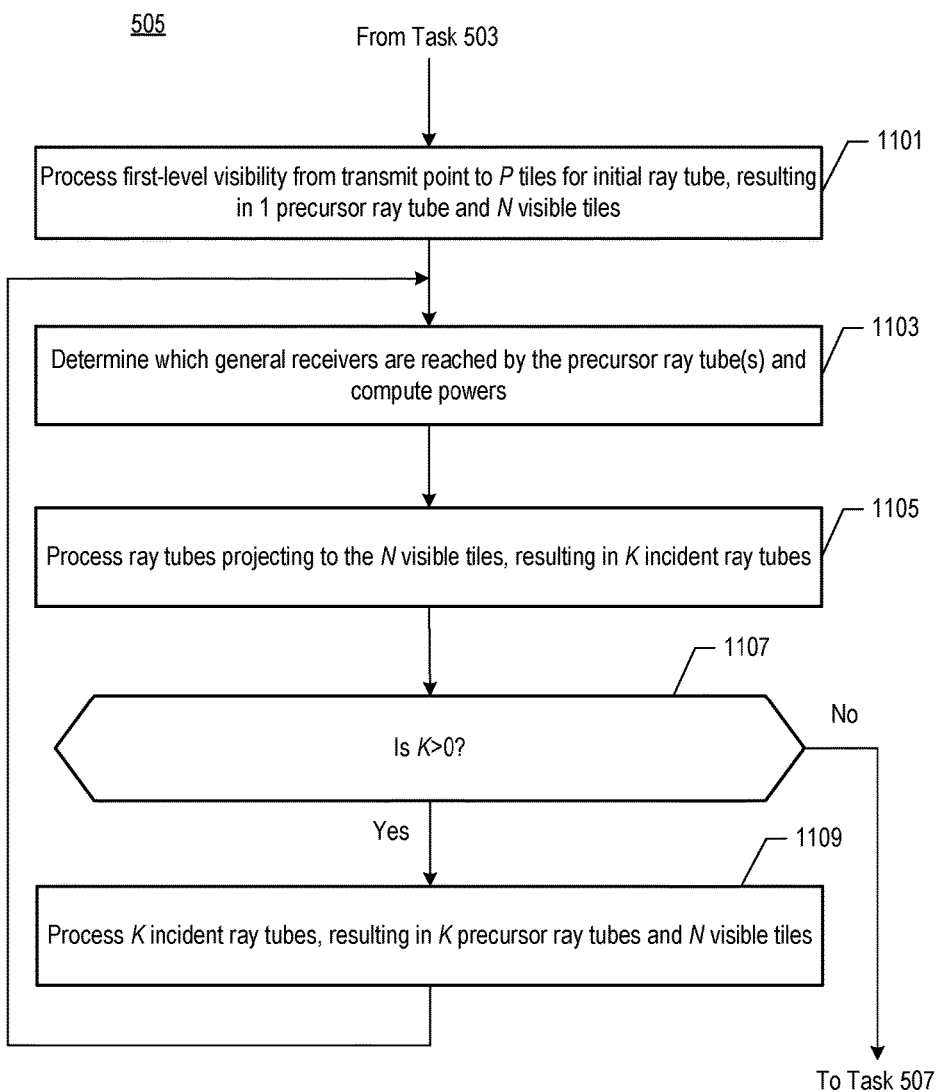
FIG. 11 depicts the sub-operations within operation 505 of method 500.

FIG. 11 depicts the sub-operations within operation 505, related to processing ray tubes. The operations that are referred to below are described in application "Discrete Environment-Driven Ray Launching," U.S. application Ser. No. 15/633,820, incorporated by reference herein.

In accordance with operation 1101, data-processing system 301 processes first-level visibility from a predetermined transmit point to P tiles for an initial ray tube, resulting in one precursor ray tube and N visible tiles. Operation 1101 is described below and in regard to FIG. 12.

In some embodiments of the present invention, even if a surface i is being ignored in accordance with operation 805 or 811, the surface can still be considered in regard to visibility checking, particularly with regard to the surface's effect on whether a line-of-sight exists between the transmit point and each of the P tiles.

In accordance with operation 1103, data-processing system 301 determines which general receivers are reached by the precursor ray tube or tubes and computes the powers received.

In accordance with operation 1105, data-processing system 301 processes ray tubes projecting to the N visible tiles, resulting in K incident ray tubes.

In accordance with operation 1107, data-processing system 301 determines if K is greater than zero. If K is greater than zero, control of task execution proceeds to operation 1109. If not, control of task execution proceeds to operation 507.

In accordance with operation 1109, data-processing system 301 processes K incident ray tubes, resulting in K precursor ray tubes and N visible tiles. Control of task execution then proceeds back to operation 1103.

In some embodiments of the present invention, even if a surface i is being ignored in accordance with operation 805 or 811, the surface can still be considered in regard to visibility checking, particularly with regard to the surface's effect on whether a line-of-sight exists between tiles. In some embodiments of the present invention, the surface can still be considered in regard to certain types of bouncings to be used for a given, incident ray tube; for example, a tile to be ignored for reflection-type bouncing can still be considered for scattering and diffraction, if the tile shares an edge with another tile that is not being ignored.

Figure 12:
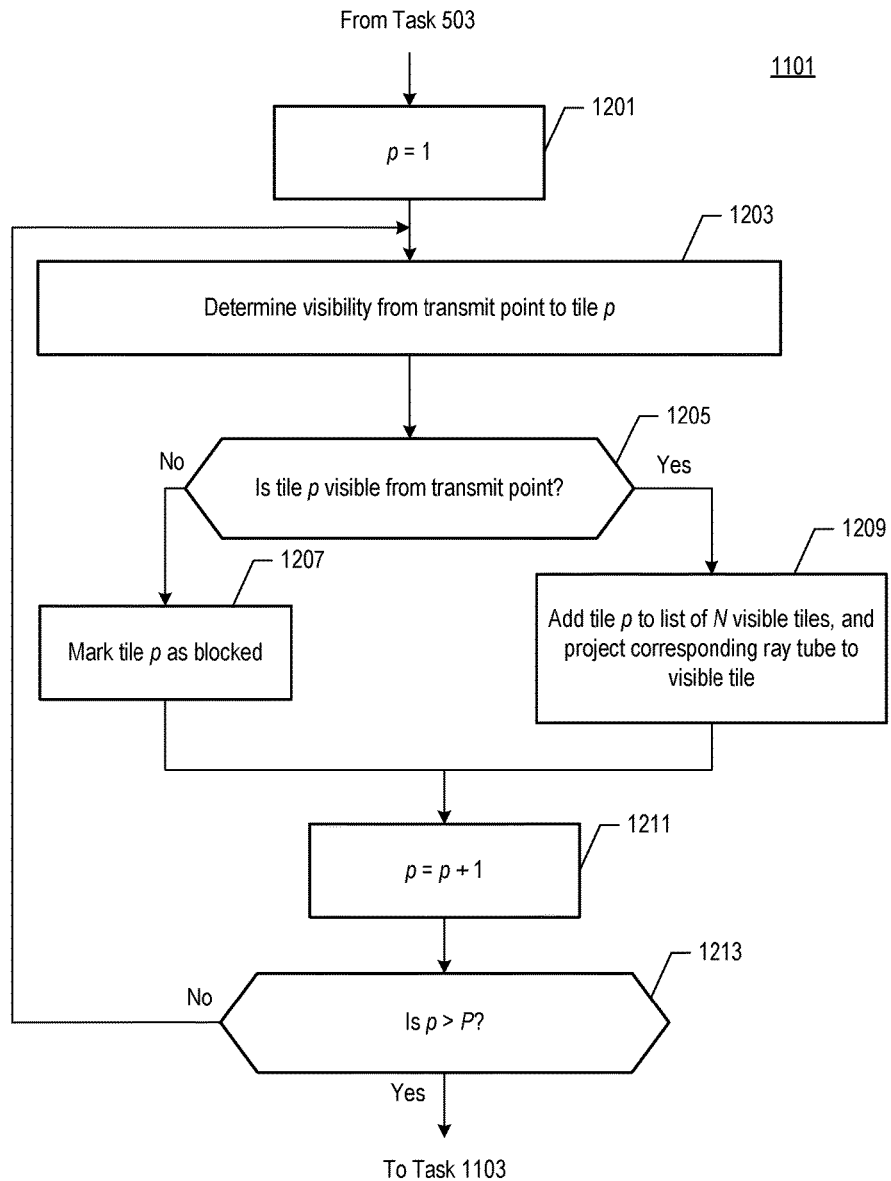
FIG. 12 depicts the sub-operations within operation 1101, related to processing first-level visibility.

FIG. 12 depicts the sub-operations within operation 1101 and provides an explanation of visibility checking, particularly for first-level visibility. In accordance with operation 1201, data-processing system 301 sets counter p equal to one.

In accordance with operations 1203 and 1205, data-processing system 301 determines visibility from the predetermined transmit point to the reference point of tile p. In accordance with the illustrative embodiment, direct (line-of-sight) visibility is determined, while in some other embodiments a different type of visibility is determined. If tile p is not visible from the transmit point, control of execution proceeds to operation 1207, wherein system 301 marks tile p as blocked. If tile p is visible from the transmit point, control of execution proceeds to operation 1209.

In accordance with operation 1209, system 301 adds tile p to a list of N visible tiles. System 301 also projects the corresponding ray tube to the visible tile; in other words, the ray tube is projected based on whether tile p's reference point is visible from the transmit point. The ray tube is defined by the visible tile to which the ray tube is being projected. In some embodiments of the present invention, the ray tube can be defined by the vertices of the tile. In some other embodiments of the present invention, the ray tube is defined by one or more points on or near the visible tile to which the ray tube is being projected. In some embodiments of the present invention, system 301 projects ray tubes only toward visible tiles, as opposed to projecting a ray tube toward a non-visible tile or in a direction where there is no tile.

System 301 increments counter p in accordance with operation 1211. System 301 then determines whether the value of p is greater than P in accordance with operation 1213. Depending on the context, the value of P can be i) the total number of tiles in the database or ii) the number of tiles that are within a predetermined distance of the spawning tile or source point. In any event, only the tiles that are established in accordance with operation 503 are considered. If p is not greater than P, control of execution proceeds back to operation 1203. Otherwise, control of execution proceeds to operation 1103.

Figure 13:
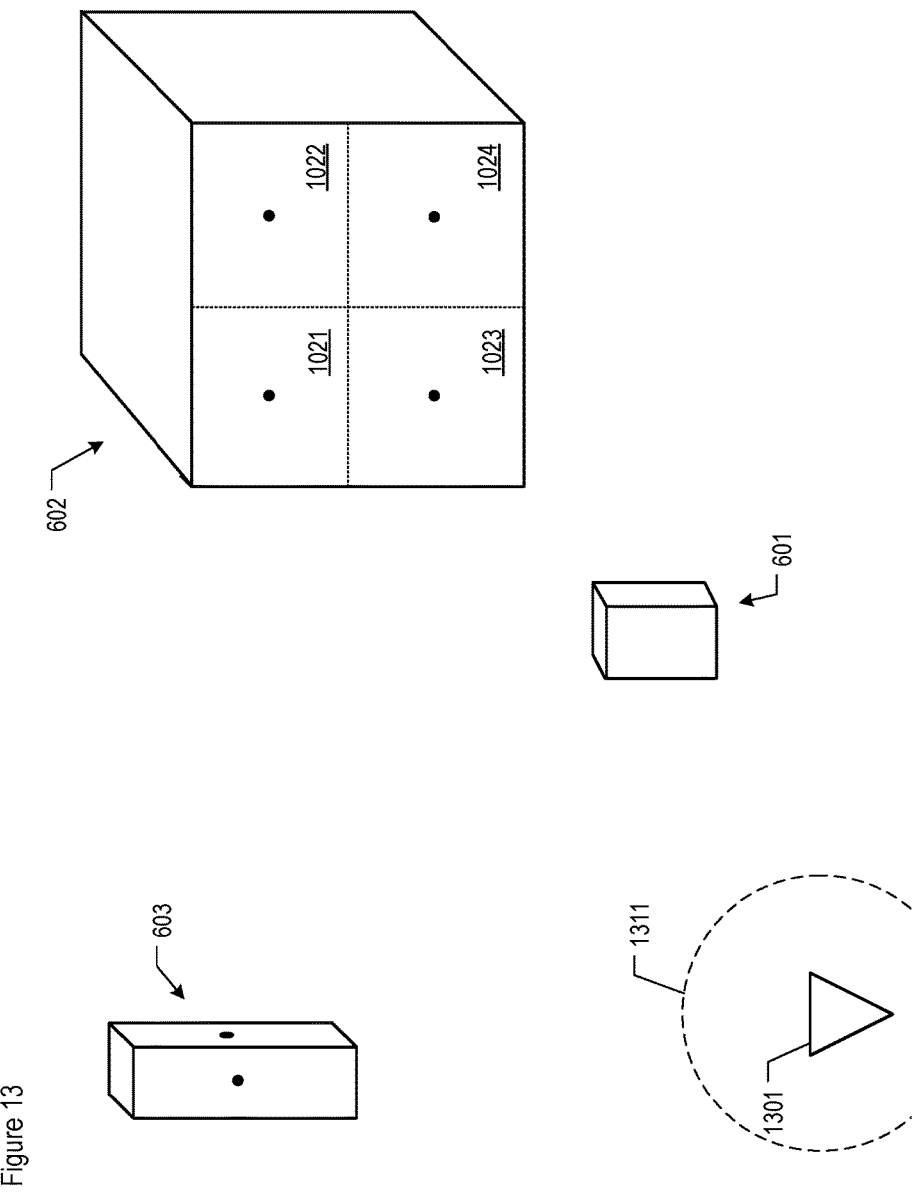
FIG. 13 depicts predetermined transmit point 1301.
Figure 14:
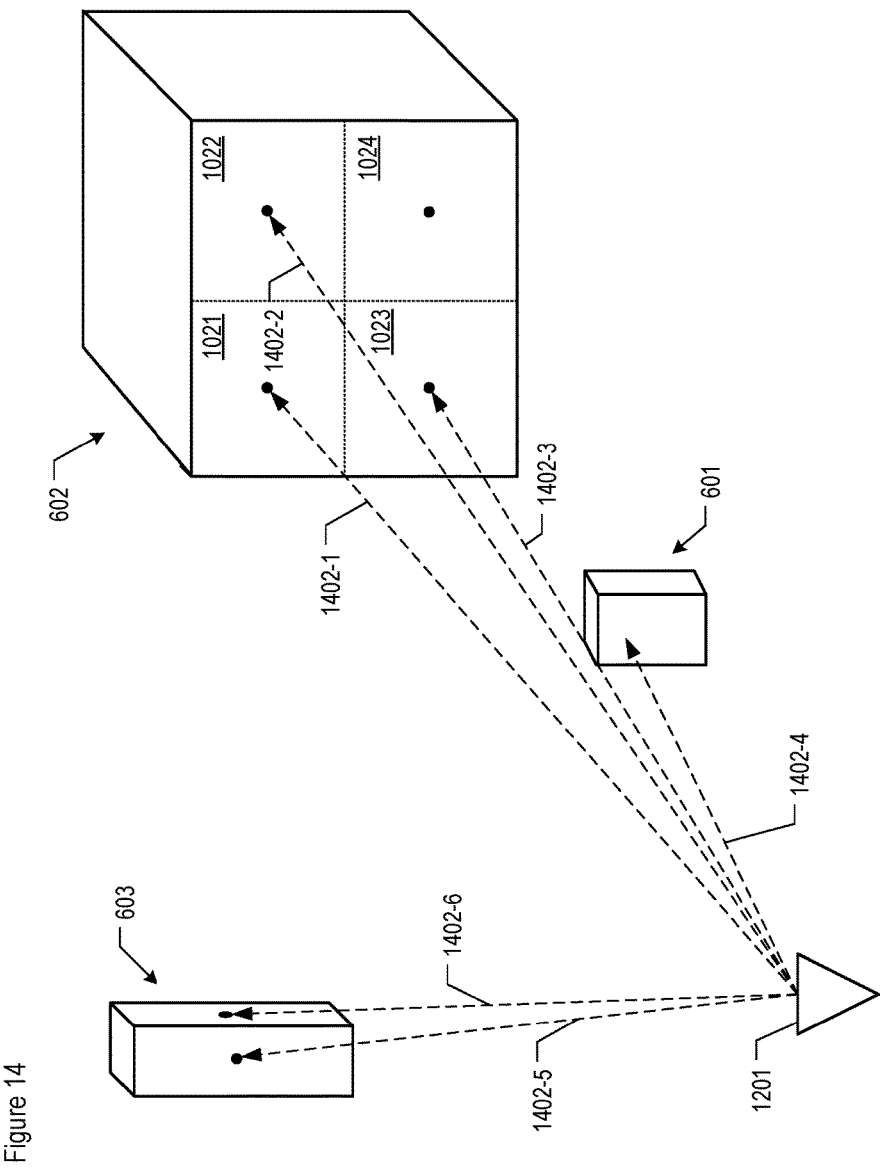
FIG. 14 depicts first-level visibility processing.

FIGS. 13 and 14 are now provided, which are intended to explain at least some of the salient sub-operations that make up operation 1101 and to provide further information on ray tubes. As can be seen in an example starting in FIG. 13, predetermined transmit point 1301 represents one such transmit point as described above, although there can be multiple transmit points from which visibility is determined. In regard to operation 1101, an "original" ray tube at the start of ray tube processing is processed, having a solid angle of 4·pi. This original ray tube is represented by ray tube 1311, which is spherical in shape. In other words, power propagates in all directions from transmit point 1301.

First-level visibility processing is depicted in FIG. 14, in which rays 1402-1, 1402-2, 1402-3, 1402-5, and 1402-6 have direct lines of sight on the reference points of their respective tiles. This being the case, the respective tiles are considered to be visible from transmit point 1301. In contrast, ray 1402-4 is blocked by structure 601; this being the case, tile 1024 is considered not to be visible from transmit point 1301. As discussed earlier, although one or more of the surfaces of structure 601 in the example are not partitioned, they can still be considered to determine whether they block one or more tiles on another surface or surfaces. A ray tube can be projected to each visible tile, wherein the tiles have already been created in accordance with operation 503. One or more points (e.g., the vertices, etc.) on or near a corresponding tile can define each ray tube. In some embodiments, a ray tube being defined by the vertices means the edge of the ray tube cross-section at the surface of the tile includes the vertices, wherein in other embodiments, a ray tube being defined by vertices means that the ray tube cross-section is associated with vertices.

It is to be understood that the disclosure teaches just one example of the illustrative embodiment and that many variations of the invention can easily be devised by those skilled in the art after reading this disclosure and that the scope of the present invention is to be determined by the following claims.

What is claimed is:

1. A method for propagation modeling, comprising:
   receiving, by a data-processing system, a dataset that is representative of a first structure within an environment, wherein the first structure is defined in the dataset as having a first surface;
   establishing, by the data-processing system, a first bounding box for the first surface;
   partitioning, by the data-processing system, at least a portion of the first bounding box into a first nonempty set of tiles, wherein the tiles in the first set of tiles have a first shape;
   projecting, by the data-processing system, a first nonempty set of ray tubes from a predetermined point toward the tiles in the first set of tiles, wherein each ray tube in the first set of ray tubes is defined by a corresponding tile in the first set of tiles toward which the ray tube in the first set of ray tubes is projected;
   evaluating, by the data-processing system, an incidence of bounced ray tubes at a predetermined receive point within the environment, wherein at least one of the bounced ray tubes is traceable to a ray tube projected in the first set of ray tubes; and
   presenting, by the data-processing system, a propagation result that is based on the evaluating of the incidence of bounced ray tubes.

2. The method of claim 1 wherein the partitioning of the first bounding box occurs only if the area of the first surface exceeds a predefined minimum area, $A_{min}$.

3. The method of claim 2 wherein $A_{min}$ is a function of a predetermined minimum length, $L_{min}$.

4. The method of claim 3 wherein $A_{min}$ is directly proportional to the square of $L_{min}$.

5. The method of claim 1 wherein the first bounding box is axis-aligned with respect to the (Cartesian) coordinate axes of the dataset.

6. The method of claim 1 wherein the first bounding box is oriented based on the outline of the first surface.

7. The method of claim 6 further comprising:
establishing, by the data-processing system, a second bounding box for a second surface in the dataset, wherein the second bounding box is oriented based on the outline of the second surface;
partitioning, by the data-processing system, at least a portion of the second bounding box into a second nonempty set of tiles;
projecting, by the data-processing system, a second nonempty set of ray tubes from the point toward the tiles in the second set of tiles, wherein each ray tube in the second set of ray tubes is defined by a corresponding tile in the second set of tiles toward which the ray tube in the second set of ray tubes is projected;
wherein at least another one of the bounced ray tubes is traceable to a ray tube projected in the second set of ray tubes.

8. The method of claim 7 wherein the tiles in the second set of tiles have a second shape different from the first shape.

9. The method of claim 1 wherein the partitioning of the first bounding box comprises determining, by the data-processing system, a set of tiles that sufficiently overlap the first surface, wherein the first set of tiles consists of the tiles in the set of tiles that sufficiently overlap.

10. The method of claim 1 wherein the partitioning of the at least a portion of the first bounding box into the first set of tiles results in multiple tiles in the first set of tiles, only if the area of the first bounding box exceeds a predefined target area, $A_{target}$.

11. A method for propagation modeling, comprising:
receiving, by a data-processing system, a dataset that is representative of a first structure within an environment, wherein the first structure is defined in the dataset as having a first surface;
establishing, by the data-processing system, i) a first bounding box for the first surface and ii) a second bounding box for a second surface represented in the dataset;
partitioning, by the data-processing system, i) at least a portion of the first bounding box into a first nonempty set of tiles and ii) the second bounding box into a second nonempty set of tiles;
projecting, by the data-processing system, i) a first nonempty set of ray tubes from a predetermined point toward the tiles in the first set of tiles, wherein each ray tube in the first set of ray tubes is defined by a corresponding tile in the first set of tiles toward which the ray tube in the first set of ray tubes is projected, and ii) a second nonempty set of ray tubes from the point toward the tiles in the second set of tiles, wherein each ray tube in the second set of ray tubes is defined by a corresponding tile in the second set of tiles toward which the ray tube in the second set of ray tubes is projected;
evaluating, by the data-processing system, an incidence of bounced ray tubes at a predetermined receive point within the environment, wherein at least one of the bounced ray tubes is traceable to a ray tube projected in the first set of ray tubes or the second set of ray tubes; and
presenting, by the data-processing system, a propagation result that is based on the evaluating of the incidence of bounced ray tubes.

12. The method of claim 11 wherein the partitioning of the first bounding box occurs only if the area of the first surface exceeds a predefined minimum area, $A_{min}$.

13. The method of claim 12 wherein $A_{min}$ is a function of a predetermined minimum length, $L_{min}$.

14. The method of claim 13 wherein $A_{min}$ is directly proportional to the square of $L_{min}$.

15. The method of claim 11 wherein the first bounding box is axis-aligned with respect to the (Cartesian) coordinate axes of the dataset.

16. The method of claim 11 wherein the tiles in the first set of tiles and the second set of tiles are of the same shape.

17. The method of claim 11 wherein the tiles in the first set of tiles and the second set of tiles are of different shapes.

18. The method of claim 11 wherein the partitioning of the at least a portion of the first bounding box into the first set of tiles results in multiple tiles in the first set of tiles, only if the area of the first bounding box exceeds a predefined target area, $A_{target}$.

19. A method for propagation modeling, comprising:
receiving, by a data-processing system, a dataset that is representative of a first structure within an environment, wherein the first structure is defined in the dataset as having a first surface;
establishing, by the data-processing system, i) a first bounding box for the first surface, wherein the first bounding box is oriented based on the outline of the first surface, and ii) a second bounding box for a second surface represented in the dataset, wherein the second bounding box is oriented based on the outline of the second surface;
partitioning, by the data-processing system, i) at least a portion of the first bounding box into a first nonempty set of tiles and ii) the second bounding box into a second nonempty set of tiles;
projecting, by the data-processing system, i) a first nonempty set of ray tubes from a predetermined point toward the tiles in the first set of tiles, wherein each ray tube in the first set of ray tubes is defined by a corresponding tile in the first set of tiles toward which the ray tube in the first set of ray tubes is projected, and ii) a second nonempty set of ray tubes from the point toward the tiles in the second set of tiles, wherein each ray tube in the second set of ray tubes is defined by a corresponding tile in the second set of tiles toward which the ray tube in the second set of ray tubes is projected;
evaluating, by the data-processing system, an incidence of bounced ray tubes at a predetermined receive point within the environment, wherein at least one of the bounced ray tubes is traceable to a ray tube projected in the first set of ray tubes or the second set of ray tubes; and
presenting, by the data-processing system, a propagation result that is based on the evaluating of the incidence of bounced ray tubes.

20. The method of claim 19 wherein the partitioning of the first bounding box occurs only if the area of the first surface exceeds a predefined minimum area, $A_{min}$.

21. The method of claim 20 wherein $A_{min}$ is a function of a predetermined minimum length, $L_{min}$.

22. The method of claim 21 wherein $A_{min}$ is directly proportional to the square of $L_{min}$.

23. The method of claim 19 wherein the partitioning of the at least a portion of the first bounding box into the first set of tiles results in multiple tiles in the first set of tiles, only if the area of the first bounding box exceeds a predefined target area, $A_{target}$.

* * * * *